(12) United States Patent
Hanawa et al.

(10) Patent No.: US 8,378,369 B2
(45) Date of Patent: Feb. 19, 2013

(54) LIGHT EMITTING UNIT, LIGHT EMITTING MODULE, AND DISPLAY DEVICE

(75) Inventors: Kenzo Hanawa, Ichihara (JP);
Takaharu Hoshina, Ichihara (JP);
Tomoyuki Takei, Ichihara (JP)

(73) Assignee: Showa Denko K.K., Tokyo (JP)

( * ) Notice: Subject to any disclaimer, the term of this patent is extended or adjusted under 35 U.S.C. 154(b) by 169 days.

(21) Appl. No.: 13/062,152

(22) PCT Filed: Sep. 1, 2009

(86) PCT No.: PCT/JP2009/065247
§ 371 (c)(1),
(2), (4) Date: Mar. 3, 2011

(87) PCT Pub. No.: WO2010/029872
PCT Pub. Date: Mar. 18, 2010

(65) Prior Publication Data
US 2012/0044667 A1 Feb. 23, 2012

(30) Foreign Application Priority Data

Sep. 9, 2008 (JP) ................................. 2008-231353
Sep. 11, 2008 (JP) ................................. 2008-233984
Sep. 11, 2008 (JP) ................................. 2008-233986

(51) Int. Cl.
*H01L 33/00* (2010.01)
*F21V 1/00* (2006.01)

(52) U.S. Cl. ........ 257/98; 362/235; 362/84; 362/311.02; 257/88; 313/498; 313/512; 438/25; 438/27

(58) Field of Classification Search .................. 362/235, 362/84, 311.02, 241, 97.1; 257/88, 98, 100; 313/483, 498, 512; 438/25, 27
See application file for complete search history.

(56) References Cited

U.S. PATENT DOCUMENTS

| | | | |
|---|---|---|---|
| 7,549,772 B2* | 6/2009 | Wang | 362/294 |
| 8,003,998 B2* | 8/2011 | Bogner et al. | 257/98 |
| 2003/0201451 A1* | 10/2003 | Suehiro et al. | 257/98 |
| 2004/0046242 A1 | 3/2004 | Asakawa | |
| 2005/0139846 A1* | 6/2005 | Park et al. | 257/98 |
| 2005/0277216 A1 | 12/2005 | Asakawa | |

(Continued)

FOREIGN PATENT DOCUMENTS

JP 2004-363537 A 12/2004
JP 2006-228856 A 8/2006

(Continued)

*Primary Examiner* — Ali Alavi
(74) *Attorney, Agent, or Firm* — Sughrue Mion, PLLC

(57) ABSTRACT

A light emitting unit (60) is provided with a resin container (61) in which a recessed portion (61*a*) is formed, an anode lead portion (62) and a cathode lead portion (63) which are provided so as to be exposed on the bottom surface of the recessed portion (61*a*), a semiconductor light emitting element (64) attached to the cathode lead portion (63) on the bottom surface (70) of the recessed portion (61*a*), and a sealing resin (65) provided so as to cover the recessed portion (61*a*). The resin container (61) is produced from a white resin containing titania as a coloring agent. The anode lead portion (62) and the cathode lead portion (63) are each configured by forming a silver-plated layer with the gloss level set in the range of 0.3-1.0 inclusive on a metal plate based on a copper alloy or the like. Thus, the efficiency of extraction of light outputted from the light emitting unit is improved.

25 Claims, 13 Drawing Sheets

U.S. PATENT DOCUMENTS

| | | |
|---|---|---|
| 2006/0147746 A1 | 7/2006 | Wakako et al. |
| 2007/0259206 A1 | 11/2007 | Oshio |
| 2008/0083973 A1 | 4/2008 | Yamada et al. |
| 2008/0128654 A1 | 6/2008 | Oshio |
| 2008/0182127 A1 | 7/2008 | Oshio |
| 2008/0191610 A1 | 8/2008 | Oshio |
| 2008/0211389 A1 | 9/2008 | Oshio |
| 2008/0258110 A1 | 10/2008 | Oshio |
| 2009/0095972 A1 | 4/2009 | Yasuda |
| 2009/0250663 A1 | 10/2009 | Oshio |
| 2009/0295272 A1 | 12/2009 | Oshio |
| 2009/0315049 A1 | 12/2009 | Urasaki et al. |

FOREIGN PATENT DOCUMENTS

| | | |
|---|---|---|
| JP | 2006-269531 A | 10/2006 |
| JP | 2007-080990 A | 3/2007 |
| JP | 2008-041699 A | 2/2008 |
| JP | 2008-091818 A | 4/2008 |
| JP | 2008-159659 A | 7/2008 |
| JP | 2008-187188 A | 8/2008 |
| WO | 2007/142018 A1 | 12/2007 |

* cited by examiner

FIG.8

| SAMPLE NUMBER | SIZE OF RESIN CONTAINER (mm × mm) | NUMBER OF BLUE LED | WHITE RESIN LIGHT ABSORPTION COEFFICIENT (%) | SILVER-PLATED LAYER | | GROUP | TYPE |
|---|---|---|---|---|---|---|---|
| | | | | GLOSS LEVEL | LIGHT ABSORPTION COEFFICIENT (%) | | |
| S1 | 3.5 × 2.8 | 1 | 7 | 0.1 | 12 | Gr.A | Type1 |
| S2 | 3.8 × 0.8 | 1 | | | | | Type2 |
| S3 | 5.0 × 5.5 | 3 | | | | | Type3 |
| S4 | 3.5 × 2.8 | 1 | 7 | 0.3 | 8 | Gr.B | Type1 |
| S5 | 3.8 × 0.8 | 1 | | | | | Type2 |
| S6 | 5.0 × 5.5 | 3 | | | | | Type3 |
| S7 | 3.5 × 2.8 | 1 | 7 | 0.5 | 6 | Gr.C | Type1 |
| S8 | 3.8 × 0.8 | 1 | | | | | Type2 |
| S9 | 5.0 × 5.5 | 3 | | | | | Type3 |
| S10 | 3.5 × 2.8 | 1 | 7 | 0.6 | 6 | Gr.D | Type1 |
| S11 | 3.8 × 0.8 | 1 | | | | | Type2 |
| S12 | 5.0 × 5.5 | 3 | | | | | Type3 |
| S13 | 3.5 × 2.8 | 1 | 7 | 0.7 | 6 | Gr.E | Type1 |
| S14 | 3.8 × 0.8 | 1 | | | | | Type2 |
| S15 | 5.0 × 5.5 | 3 | | | | | Type3 |
| S16 | 3.5 × 2.8 | 1 | 7 | 1.0 | 6 | Gr.F | Type1 |
| S17 | 3.8 × 0.8 | 1 | | | | | Type2 |
| S18 | 5.0 × 5.5 | 3 | | | | | Type3 |
| S19 | 3.5 × 2.8 | 1 | 7 | 1.3 | 6 | Gr.G | Type1 |
| S20 | 3.8 × 0.8 | 1 | | | | | Type2 |
| S21 | 5.0 × 5.5 | 3 | | | | | Type3 |

FIG.9

| SAMPLE NUMBER | I (mA) | V (V) | P (mW) | Φ (lm) | E (lm/W) | CHROMATICITY OF EMISSION COLOR | | VARIATIONS σ IN CHROMATICITY y | VERTICAL DIRECTION | | PARALLEL DIRECTION | |
|---|---|---|---|---|---|---|---|---|---|---|---|---|
| | | | | | | x | y | | x Δmax−min | y Δmax−min | x Δmax−min | y Δmax−min |
| S1 | 20 | 3.04 | 17.3 | 3.8 | 62.5 | 0.280 | 0.292 | 0.003 | 0.003 | 0.005 | 0.002 | 0.003 |
| S2 | 20 | 3.03 | 16.4 | 3.4 | 56.1 | 0.278 | 0.288 | 0.006 | 0.007 | 0.008 | 0.005 | 0.007 |
| S3 | 60 | 3.02 | 48.2 | 11.2 | 61.8 | 0.284 | 0.297 | 0.002 | 0.003 | 0.005 | 0.002 | 0.003 |
| S4 | 20 | 3.04 | 18.4 | 3.9 | 64.1 | 0.280 | 0.292 | 0.004 | 0.002 | 0.004 | 0.003 | 0.003 |
| S5 | 20 | 3.04 | 17.3 | 3.6 | 59.2 | 0.278 | 0.288 | 0.008 | 0.006 | 0.007 | 0.006 | 0.007 |
| S6 | 60 | 3.06 | 50.3 | 11.9 | 64.8 | 0.284 | 0.297 | 0.002 | 0.004 | 0.004 | 0.003 | 0.003 |
| S7 | 20 | 3.03 | 18.8 | 4.0 | 66.0 | 0.282 | 0.294 | 0.004 | 0.003 | 0.005 | 0.004 | 0.005 |
| S8 | 20 | 3.04 | 17.9 | 3.8 | 62.5 | 0.277 | 0.287 | 0.009 | 0.007 | 0.009 | 0.007 | 0.008 |
| S9 | 60 | 3.02 | 51.3 | 12.4 | 68.4 | 0.284 | 0.299 | 0.004 | 0.004 | 0.005 | 0.004 | 0.004 |
| S10 | 20 | 3.05 | 19.6 | 4.2 | 68.9 | 0.282 | 0.294 | 0.004 | 0.004 | 0.006 | 0.003 | 0.004 |
| S11 | 20 | 3.05 | 18.3 | 3.9 | 63.9 | 0.279 | 0.289 | 0.007 | 0.008 | 0.009 | 0.006 | 0.008 |
| S12 | 60 | 3.03 | 52.4 | 12.6 | 69.3 | 0.285 | 0.298 | 0.003 | 0.005 | 0.006 | 0.003 | 0.004 |
| S13 | 20 | 3.03 | 19.3 | 4.1 | 67.7 | 0.280 | 0.292 | 0.005 | 0.005 | 0.006 | 0.004 | 0.003 |
| S14 | 20 | 3.02 | 18.1 | 3.7 | 61.3 | 0.278 | 0.288 | 0.008 | 0.009 | 0.010 | 0.008 | 0.007 |
| S15 | 60 | 3.05 | 51.9 | 12.4 | 67.8 | 0.284 | 0.297 | 0.004 | 0.006 | 0.008 | 0.005 | 0.003 |
| S16 | 20 | 3.03 | 18.7 | 3.9 | 64.4 | 0.280 | 0.292 | 0.012 | 0.027 | 0.048 | 0.018 | 0.021 |
| S17 | 20 | 3.04 | 17.5 | 3.5 | 57.6 | 0.278 | 0.288 | 0.017 | 0.038 | 0.087 | 0.013 | 0.024 |
| S18 | 60 | 3.05 | 50.8 | 11.9 | 64.5 | 0.284 | 0.297 | 0.018 | 0.041 | 0.068 | 0.021 | 0.031 |
| S19 | 20 | 3.05 | 18.2 | 4.0 | 65.6 | 0.275 | 0.290 | 0.035 | 0.125 | 0.168 | 0.037 | 0.058 |
| S20 | 20 | 3.04 | 16.9 | 3.4 | 55.9 | 0.270 | 0.283 | 0.045 | 0.138 | 0.183 | 0.045 | 0.068 |
| S21 | 60 | 3.03 | 49.3 | 11.7 | 64.4 | 0.278 | 0.291 | 0.032 | 0.123 | 0.159 | 0.036 | 0.049 |

LIGHT EMITTING UNIT, LIGHT EMITTING MODULE, AND DISPLAY DEVICE

CROSS REFERENCE TO RELATED APPLICATIONS

This application is a National Stage of International Application No. PCT/JP2009/065247 filed Sep. 1, 2009, claiming priorities based on Japanese Patent Application Nos. 2008-231353 filed Sep. 9, 2008, 2008-233984 filed Sep. 11, 2008, and 2008-233986 filed Sep. 11, 2008, the contents of all of which are incorporated herein by reference in their entirety.

TECHNICAL FIELD

The present invention relates to a light emitting unit, a light emitting module and a display device using a light emitting element.

BACKGROUND ART

Recently, since a so-called white LED (LED: light emitting diode) is adopted as a backlight of a liquid crystal display of a cellular phone, production of the white LED is dramatically increased. Here, a white LED package refers to a light emitting unit including a semiconductor light emitting element (LED), which is, for example, formed by arranging a lead frame inside a recessed portion formed on a white resin case so as to be exposed, attaching a semiconductor light emitting element to the lead frame exposed inside the recessed portion and electrically connecting thereof together and forming a sealing resin containing fluorescent bodies in the recessed portion so as to cover the semiconductor light emitting element. Hereafter, it is expected that the use of the white LED in the backlight of the liquid crystal display will spread other than in the cellular phones. Moreover, as the use in the backlight of the liquid crystal display increases, adaptation into other fields of illuminating is considered.

In the case of using the white LED in the backlight of the liquid crystal display, high efficiency of the package mounting the white LED is strongly demanded for obtaining a prescribed luminance for a large-sized screen with as little electric power as possible.

However, in the aforementioned white LED package, not all of light generated in a semiconductor light emitting element is effectively used, but there are some portions where the light is confined to the inside of the package and cannot come out. A sealing resin generally has a refractive index of 1.4 to 1.5 while the refractive index of air is 1, and therefore light incident with an angle equal to or less than a constant angle due to the difference in the refractive index is reflected and returned. It is said, on the assumption that a light emitting body (for example, a semiconductor light emitting element) exists at the center of a sphere, all the light emitted from the light emitting body is not reflected since the light is incident perpendicular to the boundary surface, thus providing the highest efficiency in light extraction. Accordingly, many light emitting units (packages) each provided by forming a hemispherical lens and disposing a light emitting body at the center thereof have been proposed. However, upon actually manufacturing a prototype of the light emitting unit, sufficient light emitting efficiency could not be obtained with such a configuration.

Further, as a conventional technique described in a gazette, there exists a light emitting unit in which a resin container is provided with a recessed portion having a bottom portion on which a metal lead portion for supplying electric power to a light emitting element is exposed and a wall portion that rises up from an edge around the bottom portion, where the light emitting element is attached to the bottom portion of the recessed portion to electrically connect the metal lead portion and the light emitting element, and the recessed portion to which the light emitting element is attached is sealed with a sealing resin that transmits light from the light emitting element (refer to Patent Document 1).

CITATION LIST

Patent Literature

Patent Document 1: Japanese Patent Application Laid-Open Publication No. 2008-91818

SUMMARY OF INVENTION

Technical Problem

Illumination using the light emitting element, such as the LED, has been developed with a main demand on adopting the illumination as the backlight of the liquid crystal display. However, under the present circumstances, a small display for a cellular phone is mainly demanded and such illumination is rarely adopted into a large-area liquid crystal display such as a monitor of a personal computer and a large-sized television. It is considered this is because sufficient light output is not ensured as described above.

In response, various methods for improving luminance of the light emitting element itself, for example, the LED or the like are studied, but it is not sufficient in itself and studies adopting different approaches have been requested. It should be noted that such a problem is not limited to the above-described white LED package, but is common to a light emitting unit configured by a resin container containing a light emitting element.

An object of the present invention is to improve efficiency of extraction of light outputted from a light emitting unit.

Solution to Problem

In order to attain the object, a light emitting unit to which the present invention is applied is characterized by including: a resin container including a recessed portion; a conductor portion including a metal conductor and a silver-plated layer having a gloss level of 0.3 to 1.0 inclusive formed on a surface of the metal conductor, the conductor portion being arranged in an exposed state inside the recessed portion of the resin container; a light emitting element that is provided inside the recessed portion and electrically connected to the conductor portion; and a sealing resin having a transmittance for light emitted by the light emitting element and sealing the light emitting element in the recessed portion.

In such a light emitting unit, it can be a characteristic feature that the conductor portion reflects the light from the light emitting element with a reflection property of a Lambertian type obtained by the silver-plated layer having the gloss level of 0.3 to 1.0 inclusive.

It can also be a characteristic feature that the sealing resin contains a transparent resin that is transparent with respect to an emission wavelength of the light emitting element, and a phosphor that is dispersed into the transparent resin and converts the emission wavelength of the light emitting element into light of a longer wavelength.

Further, it can be a characteristic feature that the sealing resin has an emitting surface that emits light outputted from the light emitting element to outside, the emitting surface having a recessed shape that recesses from a boundary portion side with the resin container toward a center portion side, and an amount of recessing of the emitting surface is set in a range of 20 μm to 100 μm inclusive.

Furthermore, it can be a characteristic feature that a plurality of the light emitting elements are attached to the inside of the recessed portion.

It can also be a characteristic feature that the resin container is whitened by using a white pigment.

Further, it can be a characteristic feature that the gloss level of the silver-plated layer in the conductor portion is from 0.5 to 0.7 inclusive.

Furthermore, it can be a characteristic feature that the sealing resin is composed of a silicone resin.

From another standpoint, a light emitting unit to which the present invention is applied is characterized by including: a resin container provided with a recessed portion including a bottom surface and a wall surface that rises up from an edge around the bottom surface; a conductor portion including a metal conductor and a silver-plated layer having a gloss level of 0.3 to 1.0 inclusive formed on a surface of the metal conductor, the conductor portion being arranged on the bottom surface of the recessed portion in an exposed state; a light emitting element that is provided on the bottom surface of the recessed portion and electrically connected to the conductor portion; and a sealing resin having a transmittance for light emitted by the light emitting element and sealing the light emitting element in the recessed portion.

In such a light emitting unit, it can be a characteristic feature that the conductor portion reflects the light from the light emitting element with a reflection property of a Lambertian type obtained by the silver-plated layer having the gloss level of 0.3 to 1.0 inclusive.

It can also be a characteristic feature that the sealing resin contains a transparent resin that is transparent with respect to an emission wavelength of the light emitting element and a phosphor that is dispersed into the transparent resin and converts the emission wavelength of the light emitting element into light of a longer wavelength, and the light emitting element is attached to a position different from a center position of the bottom surface.

Further, it can be a characteristic feature that the resin container is composed of a resin containing fine particles of titania.

Furthermore, it can be a characteristic feature that the gloss level of the silver-plated layer in the conductor portion is from 0.5 to 0.7 inclusive.

It can also be a characteristic feature that a light reflectance in a visible region of the resin container and the silver-plated layer of the conductor portion is from 85% to 98% inclusive.

Moreover, it can be a characteristic feature that an area of the conductor portion exposed on the bottom surface of the recessed portion is set to equal to or more than half of a total area of the bottom surface.

From further standpoint, a light emitting module to which the present invention is applied is characterized by including: a substrate; and a plurality of light emitting units attached to the substrate, wherein each of the light emitting units includes: a resin container including a recessed portion; a conductor portion including a metal conductor and a silver-plated layer having a gloss level of 0.3 to 1.0 inclusive formed on a surface of the metal conductor, the conductor portion being arranged in an exposed state inside the recessed portion of the resin container; a light emitting element that is provided inside the recessed portion and electrically connected to the conductor portion; and a sealing resin having a transmittance for light emitted by the light emitting element and sealing the light emitting element in the recessed portion.

In such a light emitting module, it can be a characteristic feature that the conductor portion of the light emitting unit reflects the light from the light emitting element with a reflection property of a Lambertian type obtained by the silver-plated layer having the gloss level of 0.3 to 1.0 inclusive.

It can also be a characteristic feature that the sealing resin of the light emitting unit contains a transparent resin that is transparent with respect to an emission wavelength of the light emitting element, and a phosphor that is dispersed into the transparent resin and converts the emission wavelength of the light emitting element into light of a longer wavelength.

Further, it can be a characteristic feature that the light emitting element of the light emitting unit is attached to a position different from a center position of the bottom surface.

Furthermore, it can be a characteristic feature that the resin container of the light emitting unit is whitened by using a white pigment.

It can also be a characteristic feature that the gloss level of the silver-plated layer in the conductor portion of the light emitting unit is from 0.5 to 0.7 inclusive.

From further standpoint, the present invention is a display device including a display panel that performs display of an image and a backlight that is provided on a back surface of the display panel and applies light from the back surface side of the display panel, and characterized in that the backlight includes a substrate and a plurality of light emitting units attached to the substrate, wherein each of the light emitting units includes: a resin container including a recessed portion; a conductor portion including a metal conductor and a silver-plated layer having a gloss level of 0.3 to 1.0 inclusive formed on a surface of the metal conductor, the conductor portion being arranged in an exposed state inside the recessed portion of the resin container; a light emitting element that is provided inside the recessed portion and electrically connected to the conductor portion; and a sealing resin containing a transparent resin that is transparent with respect to an emission wavelength of the light emitting element and a phosphor that is dispersed into the transparent resin and converts the emission wavelength of the light emitting element into light of a longer wavelength, and sealing the light emitting element in the recessed portion.

In such a display device, it can be a characteristic feature that the conductor portion of the light emitting unit reflects the light from the light emitting element with a reflection property of a Lambertian type obtained by the silver-plated layer having the gloss level of 0.3 to 1.0 inclusive.

It can also be a characteristic feature that the resin container of the light emitting unit is whitened by using a white pigment.

Further, it can be a characteristic feature that the gloss level of the silver-plated layer in the conductor portion of the light emitting unit is from 0.5 to 0.7 inclusive.

Advantageous Effects of Invention

According to the present invention, it is possible to improve the efficiency of extraction of light outputted from the light emitting unit.

BRIEF DESCRIPTION OF DRAWINGS

FIG. 8 is a diagram showing a relation between each sample and a configuration thereof used in examples and comparative examples;

FIG. 9 is a diagram showing a relation between each of the samples used in the examples and the comparative examples and obtained properties;

DESCRIPTION OF EMBODIMENTS

Exemplary embodiments of the present invention will be described in detail below with reference to the accompanying drawings.

Exemplary Embodiment 1

Figure 1:
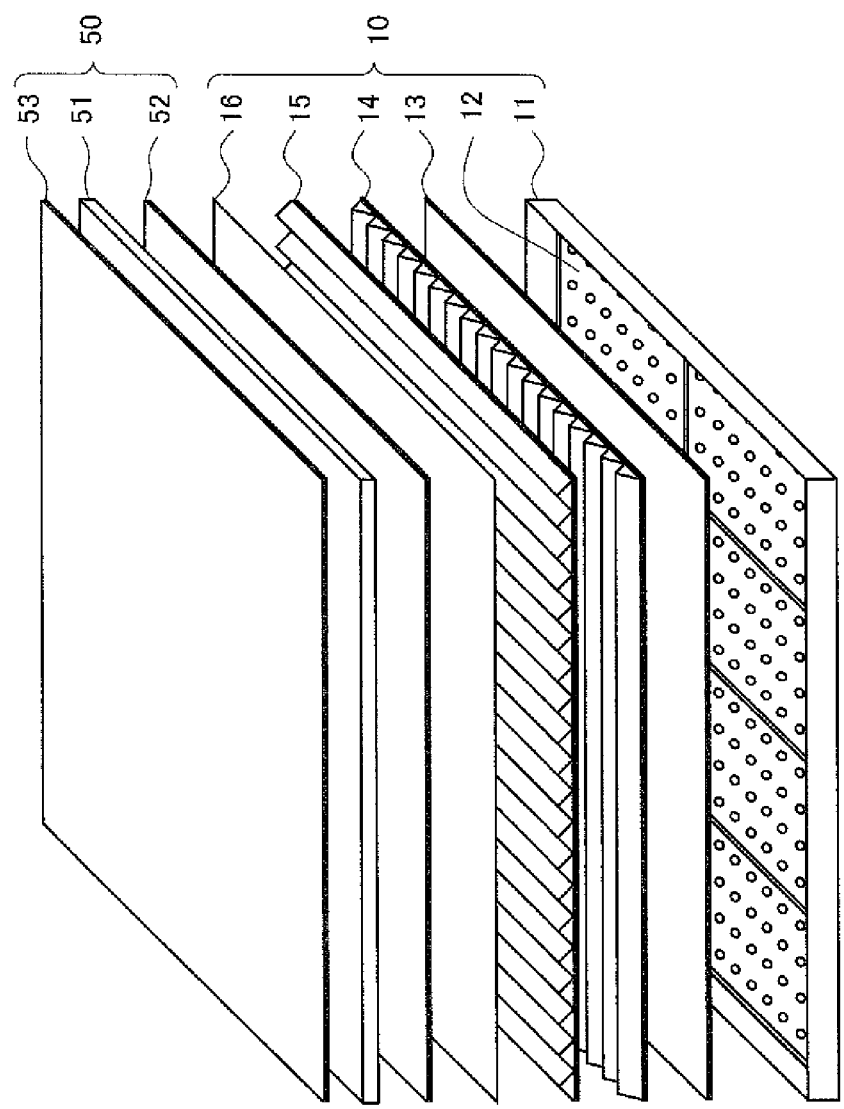
FIG. 1 is a diagram showing an entire configuration of a liquid crystal display device.

FIG. 1 is the diagram showing the entire configuration of the liquid crystal display device to which the present exemplary embodiment is applied. The liquid crystal display device includes a liquid crystal display module 50 and a backlight unit 10 provided on a back surface side (in FIG. 1, on a lower portion side) of the liquid crystal display module 50.

The backlight unit 10 includes a backlight frame 11 and plural light emitting modules 12 contained in the backlight frame 11, in each of which semiconductor light emitting elements are arranged. The backlight unit 10 also includes, as a laminate of optical films, a diffusing plate 13 that is a plate (or a film) for dispersing or diffusing light to make an entire surface have uniform brightness, and prism sheets 14 and 15 that have a forward light-gathering effect. A luminance-improving film 16 of a diffusion- or reflection-type for improving the luminance is also provided as necessary.

On the other hand, the liquid crystal display module 50 includes a liquid crystal panel 51 configured by a liquid crystal sandwiched by a couple of glass substrates and polarizing plates 52 and 53 each laminated on the corresponding glass substrate of the liquid crystal panel 51 to impose limitation on oscillations of a lightwave in a certain direction. Further, peripheral members, such as a driving LSI not shown in the figure, are mounted to the present liquid crystal display device.

The liquid display panel 51 as an example of a display panel is configured including various kinds of constituents not shown in the figure. For example, on the two glass substrates, provided are a display electrode, an active element such as a thin film transistor (TFT: Thin Film Transistor), a liquid crystal, a spacer, a sealing agent, an oriented film, a common electrode, a protection film, a color filter and the like.

Figure 2A:
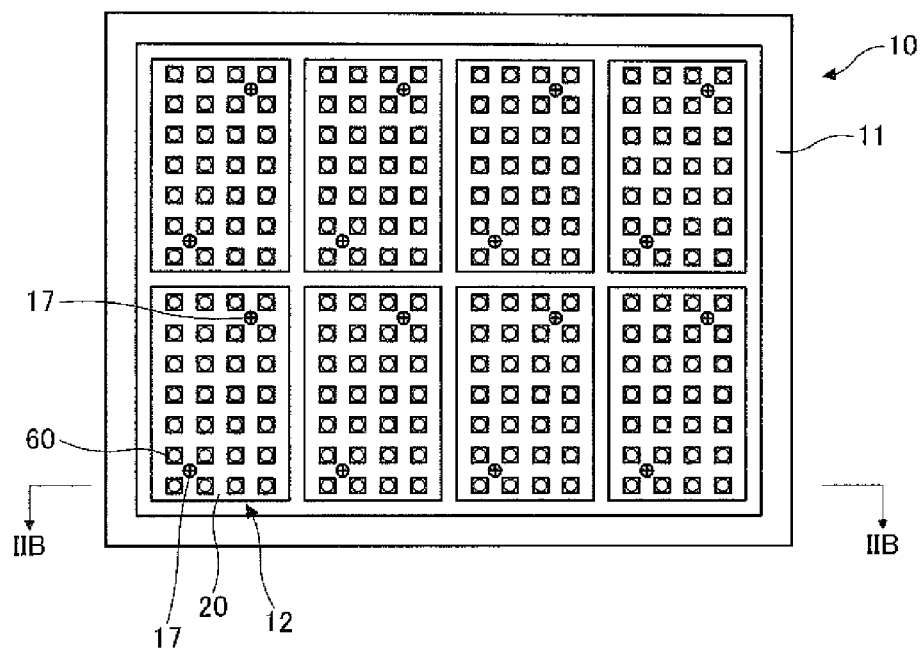
FIGS. 2A and 2B are diagrams illustrating a structure of a backlight unit.
Figure 2B:
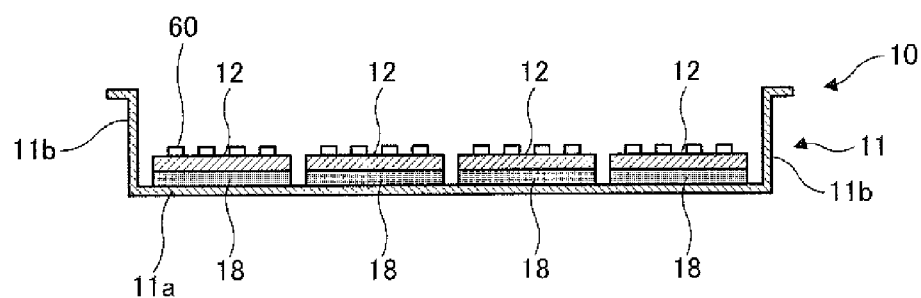

FIGS. 2A and 2B are the diagrams illustrating the structure of the backlight unit 10. Here, FIG. 2A is a top view of the backlight frame 11 to which the light emitting module 12 is mounted as viewed from a side of the liquid crystal display module 50 shown in FIG. 1, and FIG. 2B is a IIB-IIB cross sectional view of FIG. 2A. In the present embodiment, the backlight structure of a direct-lighting type is employed, in which a light source is placed immediately below the back surface of the liquid crystal display module 50. In this backlight structure, light emitting units 60 each of which has the light emitting element are almost uniformly arranged in the entire back surface of the liquid crystal display module 50. It should be noted that the light emitting unit 60 used in the present exemplary embodiment is generally called an LED package.

The backlight frame 11 forms a casing structure made of, for example, aluminum, magnesium, iron, a metal alloy including thereof or the like. Inside the casing structure, there is adhered, for example, a polyester film or the like having a high white reflectivity to also function as a reflector. As the casing structure, a back surface portion 11a corresponding to the dimension of the liquid crystal display module 50 and a side surface portion 11b that surrounds four corners of the back surface portion 11a are provided. Moreover, heat release sheets 18 may be provided on the back surface portion 11a.

In the example shown in FIG. 2A, plural light emitting modules 12 (in this example, 8) are provided. Each light emitting module 12 is fastened to the backlight frame 11 with plural screws 17 (in this example, two screws for one light emitting module 12) via the heat release sheet 18.

The light emitting module 12 includes a wiring board 20 as an example of a substrate and the plural (in this example, 28) light emitting units 60 mounted on the wiring board 20. It should be noted that each light emitting unit 60 is adapted to output white light with a later-described configuration.

Figure 3A:
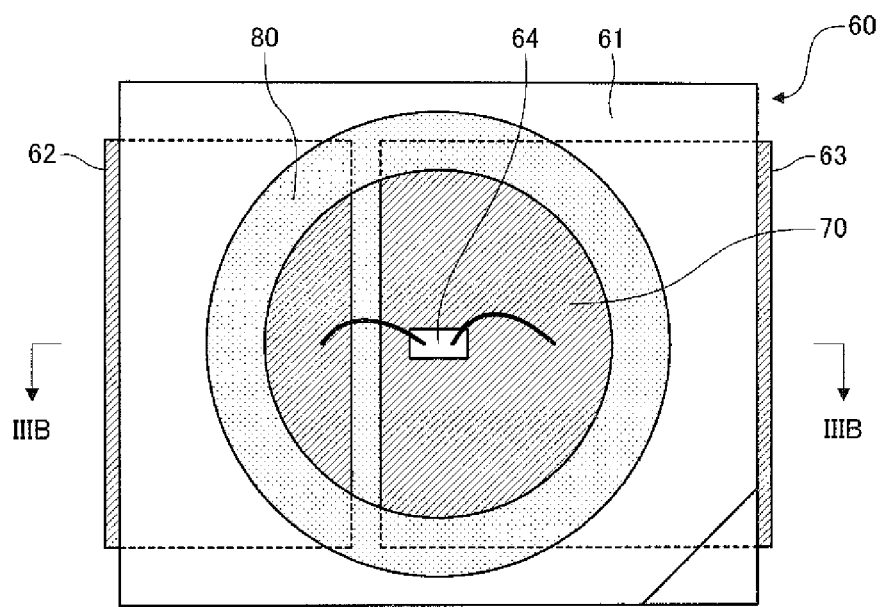
FIGS. 3A and 3B are diagrams illustrating a configuration of a light emitting unit of the exemplary embodiment 1.
Figure 3B:
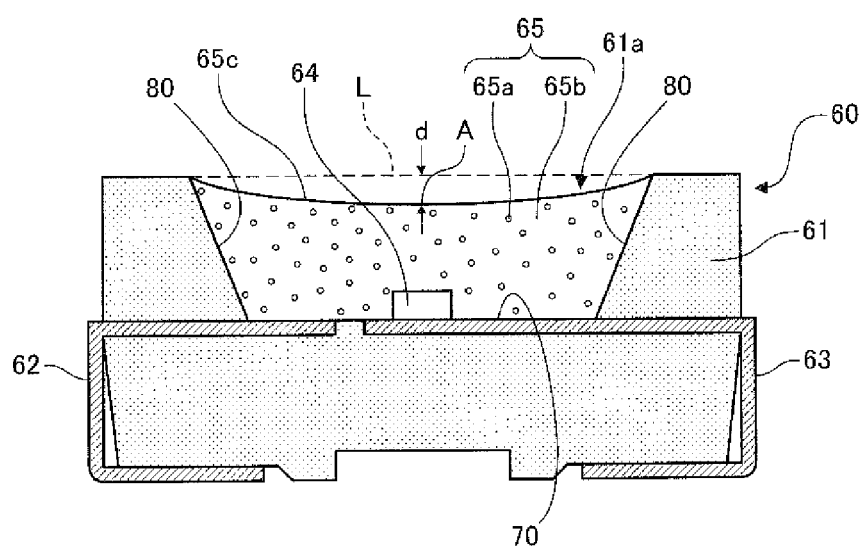

FIGS. 3A and 3B are diagrams illustrating a configuration of the light emitting unit 60 used in the present exemplary embodiment. Here, FIG. 3A is a top view of the light emitting unit 60, and FIG. 3B is a IIIB-IIIB cross-sectional view of FIG. 3A.

The light emitting unit 60 includes a resin container 61 in which a recessed portion 61a is formed on an upper portion side thereof, an anode lead portion 62 and a cathode lead portion 63 formed by a lead frame integrated with the resin container 61, a semiconductor light emitting element 64 attached to a bottom surface 70 of the recessed portion 61a and a sealing resin 65 provided to cover the recessed portion 61a. It should be noted that the sealing resin 65 is omitted in FIG. 3A.

The resin container 61 is formed by injection molding of a thermoplastic resin containing a white pigment (referred to as a white resin in the following description) over a metal lead portion including the anode lead portion 62 and the cathode lead portion 63.

In the white resin constituting the resin container 61, the percentage of white pigment content or the particle diameter of the white pigment is adjusted so that a reflectance of visible light is from 85% to 98% inclusive. In other words, an absorption coefficient of visible light of the resin container 61 is less than 15%. As the white pigment, it is preferable to employ fine-grained titania (titanium oxide). Titania has a high refractive index and a low absorption coefficient of light compared to other white pigments, thus being preferably used for the resin container 61 of the present exemplary embodiment. Other white pigments, for example, aluminum oxide has significantly low whiteness compared to titania, thereby being less preferred compared to titania. However, since titania has a photocatalytic function, there is a potential for alteration of the quality of resin. Accordingly, it is preferable to apply a surface treatment to titania with aluminum hydroxide or the like. If the surface treatment is insufficient, the quality of the resin constituting the resin container 61 is altered and the resin absorbs a specific wavelength, and thereby change in chromaticity coordinates over time occurs in some cases. Consequently, selection of titania as the white pigment and an additive amount thereof is important. To improve the light reflectance of the resin container 61, it would be better to increase the additive amount of titania, but there exists an upper limit for the additive amount in terms of decrease of fluidity for forming the shape of the resin container 61 by injection molding or the like.

Further, since there are plural processes in the manufacturing process, in which temperature is applied, such as reflow of the solder, selection of the white pigment material is made in due consideration of heat resistance. As a resin for the base material, PPA (polyphthalamide) is most commonly used, but liquid crystal polymer, epoxy resin, polystyrene or the like may also be employed.

The recessed portion 61a provided in the resin container 61 includes the bottom surface 70 having a circular shape and a wall surface 80 that rises up from an edge around the bottom surface 70 so as to open toward the upper portion side of the resin container 61. Here, the bottom surface 70 is configured with the anode lead portion 62 and the cathode lead portion 63 both exposed at the recessed portion 61a and the white resin of the resin container 61 that exposes at a clearance between the anode lead portion 62 and the cathode lead portion 63. However, the region that is equal to or more than half of the bottom surface 70 is occupied by the anode lead portion 62 and the cathode lead portion 63. On the other hand, the wall surface 80 is configured by the white resin that constitutes the resin container 61. It should be noted that the shape of the bottom surface 70 may be any of a circle, a rectangle, an ellipse and a polygon. Moreover, the shape of the wall surface 80 may be any of a circle, a rectangle, an ellipse and a polygon, which may be the same as the shape of the bottom surface, or different as in the present exemplary embodiment.

The anode lead portion 62 and the cathode lead portion 63 as an example of a conductor portion are holded while part of each being caught in the resin container 61 and the other part of each being exposed to the outside of the resin container 61 to serve as a terminal for applying a current to the semiconductor light emitting element 64. On the premise of a surface mount technology, as shown in FIG. 3B, it is preferable to bend each of the anode lead portion 62 and the cathode lead portion 63 toward the back side of the resin container 61 so as to provide a tip end thereof on a bottom portion of the resin container 61.

Further, the anode lead portion 62 and the cathode lead portion 63, namely the lead frame, is a metal plate having a thickness of the order of 0.1 mm-0.5 mm, a base thereof being a metal conductor such as a copper alloy or the like, and a silver-plated layer being formed on a surface thereof by silver plating. Accordingly, on the bottom surface 70 of the recessed portion 61a, the silver-plated layer of each of the anode lead portion 62 and the cathode lead portion 63 is exposed. It is preferable that the light reflectance of the anode lead portion 62 and the cathode lead portion 63, namely the light reflectance of the silver-plated layer is from 85% to 98% inclusive. Also, the gloss level of the anode lead portion 62 and the cathode lead portion 63 within the range of 0.3 to 1.0 inclusive is preferable, and the range of 0.5 to 0.7 inclusive is more preferable. Here, the gloss level is prescribed in JISZ8741 and assumed to be a value in the case where an incident angle of the incident light is 60°.

In general, by studying the conditions in silver plating, it is possible to control the state of asperities on the surface thereof. The silver plating of the lead frame is generally performed by electrolytic plating using a cyanide solution. In the electrolytic plating, a portion where silver is once deposited becomes a protrusion and the current is apt to concentrate on the pointed portion, and thereby further growth occurs in the periphery of the protrusion. As a result, a so-called dendritic deposition easily occurs. Especially, in the electrolytic silver plating, this tendency is remarkable. If silver electrolysis of the cyanide solution is conducted with higher deposition rate, a so-called non-glossy white plating is generated. This shows light reflection property that is extremely close to Lambertian reflection, but instead allows the light absorption coefficient to be relatively high, exceeding 10%. In contrast, if a gloss agent such as Se is added in performing silver plating, the dendritic growth is suppressed and smoothed, and thereby a surface showing a behavior close to perfect mirror reflection becomes available. Even in this case, if the gloss agent is added until the perfect mirror surface is available, the additives remain on the deposition surface and the light absorption coefficient becomes higher. The form (gloss level) of a silver-plated surface can be appropriately adjusted by making conditions such as concentration of $Ag^+$ in silver plating, temperature, pH, cyanide ion concentration, addition of other cation or anion, current density, organic additives, and the like.

The semiconductor light emitting element 64 is bonded on the cathode lead portion 63 exposed at the bottom surface 70 by die bonding adhesive made of silicone resin or epoxy resin to be fixed.

The semiconductor light emitting element 64 has an n-electrode and a p-electrode; the p-electrode and the n-electrode are connected to the anode lead portion 62 and the cathode lead portion 63, respectively, via a bonding wire. It should be noted that, in the light emitting unit 60 of the present exemplary embodiment, as shown in FIG. 3A, the semiconductor light emitting element 64 is attached to the nearly central portion of the bottom surface 70 having a circular shape.

The semiconductor light emitting element 64 emits blue light having a main emission peak in the wavelength region of 430 nm to 500 nm inclusive, and includes at least a seed layer made of AlN formed on a sapphire substrate, a foundation layer formed on the seed layer and a laminated semiconductor layer anchored by GaN. The laminated semiconductor layer is configured by laminating the foundation layer, an n-type semiconductor layer, a light emitting layer and a p-type semiconductor layer in this order from the substrate side.

The sealing resin 65 is configured with a phosphor (hereinafter, also referred to as phosphor powder) 65a including at least two types, which absorbs light emitted from the semiconductor light emitting element 64 and then emits light of longer wavelength, and a transparent resin 65b that contains the phosphor powder 65a in a uniformly dispersed state. In this example, the phosphor powder 65a includes a green phosphor that absorbs the blue light emitted from the semiconductor light emitting element 64 and then emits green light, and a red phosphor that absorbs the blue light emitted from the semiconductor light emitting element 64 and then emits red light. It should be noted that the red phosphor is also excited by the light emitted by the green phosphor; therefore movement of chromaticity of the light emitted by the light emitting unit 60 varies complicatedly depending upon the ratio between the green and red phosphors. To the adjustment of such chromaticity, related are the emission wavelength of the semiconductor light emitting element 64, the ratio between the green phosphor and the red phosphor, the density of phosphor in the sealing resin 65 and a shape of the top surface of the sealing resin 65, namely an emitting surface 65c from which the light is emitted.

In the light emitting unit 60, owing to the blue light emitted by the semiconductor light emitting element 64, the green light emitted by the green phosphor contained in the phosphor powder 65a and the red light emitted by the red phosphor similarly contained in the phosphor powder 65a, three primary colors of blue, green and red are completed. Consequently, white light is emitted from the emitting surface 65c of the sealing resin 65. The color reproduction range in the case where this white light is used for the backlight of the liquid crystal display device is determined by the wavelength of the main emission peak and a half width of the semiconductor light emitting element 64 and the wavelength of the emission peak and a half width of the phosphor powder 65a.

As the green phosphor suitably used for the above-described phosphor powder 65a, a silicate phosphor ($BaSiO_4$:$Eu^{2+}$) is preferred, and as the red phosphor, a phosphor nitride ($CaAlSiN_3$:$Eu^{2+}$) is preferred. This is because these green phosphor and red phosphor can generate powder such that a true density thereof is relatively low, which ranges from 3.5 g/cm$^3$ to 4.7 g/cm$^3$, and a mean diameter is of the order of 10 µm in mass average.

Here, since the green phosphor ($BaSiO_4$:$Eu^{2+}$) has an excitation wavelength of 380 nm to 440 nm and an emission wavelength of 508 nm, both of the excitation wavelength and the emission wavelength are too short to meet a required property to convert the blue light used in the present exemplary embodiment into the green light. However, by replacing part of Ba with other alkaline earth element such as Sr, Ca and Mg, the excitation wavelength and the emission wavelength can be moved to longer wavelength side. In the present exemplary embodiment, it is preferable that the excitation wavelength and the emission wavelength are adjusted to 455 nm and 528 nm, respectively.

The red phosphor ($CaAlSiN_3$:$Eu^{2+}$) has an excitation wavelength of 400 nm to 500 nm and an emission wavelength of 640 nm. The half width of a peak wavelength is different depending upon a purpose of use. For illumination, a waveform of the peak wavelength that is as broad as possible is preferred, but with a purpose of use in the backlight of the liquid crystal display device as in the present exemplary embodiment, a waveform that is as sharp as possible is preferred. To improve color rendering properties (degree of sameness of a color with respect to a color in the sunlight) for illumination, a wavelength distribution is required to be the same as that of the sunlight as possible and also required to include all wavelengths to the similar extent. In contrast, the color reproduction range in the case of being applied to the backlight of the liquid crystal display device is required such that three points on the chromaticity coordinates, blue, green and red are as widespread as possible. That is, it is important that the color purity is as high as possible. To that end, it is preferable to make the wavelength distribution of three primary colors as sharp as possible.

On the other hand, as the transparent resin 65b that composes the sealing resin 65, various kinds of resin that is transparent in the visible region may be applied, but from the viewpoint of heat-resistivity, it is preferable to use silicone resin.

Further, in the sealing resin 65, the emitting surface 65c for emitting white light is provided. In this example, as shown in FIG. 3B, the emitting surface 65c is formed on the upper portion side of the resin container 61, namely the opening portion side of the recessed portion 61a.

In this light emitting unit 60, as shown in FIG. 3B, the central portion of the emitting surface 65c is recessed below the top surface of the resin container 61, and an amount of recessing d is set within a range of −20 µm to −100 µm from the top surface. The amount of recessing d is a difference between the height of the opening edge of the resin container 61 and the lowest height of the emitting surface 65c. It should be noted that, here, the side approaching the semiconductor light emitting element 64 is regarded as minus (−) when the height of the opening edge of the resin container 61 is regarded as a reference (0). Accordingly, the range of the amount of recessing d of −20 µm to −100 µm from the top surface means that, when the height of the opening edge of the resin container 61 is regarded as 0 µm, the lowest height of the emitting surface 65c is positioned on the side of the semiconductor light emitting element 64 within the range of 20 µm to 100 µm from the top surface.

The amount of recessing d is obtained as a distance between a point A and an extended surface L, where the extended surface L of the opening edge of the resin container 61 is hypothetically set and the central point of the sealing resin 65 cured in the recessed portion 61a set as A. Actual measurement is conducted by a laser displacement gage (for example, ZSHLD2 manufactured by OMRON Corporation).

Then, description will be given to light emitting operation of the light emitting unit 60 shown in FIGS. 3A and 3B.

When a current is fed to the semiconductor light emitting element 64 while regarding the anode lead portion 62 as a positive electrode and the cathode lead portion 63 as a negative electrode, the semiconductor light emitting element 64 emits blue light. The blue light emitted by the semiconductor light emitting element 64 proceeds within the sealing resin 65, and is emitted from the emitting surface 65c to the outside directly or after being reflected by the bottom surface 70 or the wall surface 80. However, part of the light heading for the emitting surface 65c is reflected by the emitting surface 65c and proceeds within the sealing resin 65 again. During this time, in the sealing resin 65, part of the blue light is converted into the green light and the red light by the phosphor powder 65a, and the converted green light and red light are emitted from the emitting surface 65c to the outside together with the blue light directly or after being reflected by the bottom surface 70 or the wall surface 80. Consequently, the white light including the blue light, the green light and the red light is emitted from the emitting surface 65c.

In the case where the phosphor powder 65a is uniformly dispersed in the transparent resin 65b in the sealing resin 65 and the sealing resin 65 is contained in the recessed portion 61a of the resin container 61 made of white resin whose light reflectance is from 85% to 98% inclusive, as the light emitting unit 60 in the present exemplary embodiment, the behavior of light will be described as follows. For example, among the light outputted from the semiconductor light emitting element 64, the light incident on the white resin constituting the wall surface 80 and the bottom surface 70 moves complicatedly to travel back and forth many times, such that the light is reflected and returned to the sealing resin 65 and then incident on the white resin again, and finally, passes through the sealing resin 65 and exits to the emitting surface 65c. In this case, the manner of reflection and the light absorption coefficient of the silver-plated layer provided on the bottom surface 70 have a large influence. In the present exemplary embodiment, the reflection property of a so-called Lambertian reflection type is provided to the silver-plated layer and the white resin constituting the bottom surface 70 and the wall surface 80, thus reducing the amount of light absorbed into the silver-plated layer and the white resin constituting the bottom surface 70 and the wall surface 80 compared to the case where these are provided with a reflection property of a so-called mirror reflection type. Consequently, the reason why there appears a difference in the amount of light outputted by the light emitting unit 60, namely brightness, between the reflection property of the Lambertian reflection type and the reflection property of mirror reflection type is due to the difference in the light absorption coefficient in the bottom surface 70 or the wall surface 80; if it is assumed that the light absorption coefficient is zero, there occurs no difference in the output. Sensuously, it seems that the light outputted from the semiconductor light emitting element 64 can be led to the emitting surface 65c with smaller number of reflections by providing the reflection property of the mirror reflection type to the bottom surface 70 or the wall surface 80 constituting the recessed portion 61a. However, in reality, the amount of light absorbed into the bottom surface 70 or the wall surface 80 can be reduced by providing the reflection property of the Lambertian reflection type to the bottom surface 70 or the wall surface 80 because there exists the complicated light behavior as described above.

Among these, the light heading for the bottom surface 70 or the wall surface 80 repeats reflections by the silver-plated layer or the white resin constituting the bottom surface 70 or the wall surface 80 and finally exits to the emitting surface 65c. In contrast, the light heading for the emitting surface 65c is related to the reflection by the bottom surface 70 or the wall surface 80. That is, the part of the light does a repeat of being diffused by the phosphor powder 65a dispersed in the sealing resin 65, being reflected by the white resin constituting the wall surface 80 and being reflected again by the silver-plated layer or the white resin of the bottom surface 70, and thereafter exits to the emitting surface 65c. During the process of such diffusions and reflections, absorption of light occurs though only gradually. To effectively extract the light outputted by the semiconductor light emitting element 64, the number of diffusions or reflections of the light should be small. However, from the viewpoint of suppressing fluctuations in chromaticity depending upon the positions on the emitting surface 65c, the diffusions and the reflections should be repeated. As discussed above, a contradictory idea of effectively extracting the light outputted from the semiconductor light emitting element 64 while eliminating the fluctuations in chromaticity in each direction is required in actuality.

On such a demand, in the present exemplary embodiment, the resin container 61 is configured with a white resin that absorbs less light and the silver-plated layer is formed on the surface of the anode lead portion 62 and the cathode lead portion 63 constituting the lead frame, thus reducing the light absorption coefficient of the visible light in the recessed portion 61a. Specifically, the light absorption coefficient of the silver-plated Slayer and the white resin constituting the bottom surface 70 and the wall surface 80 in the visible region is set in a range that is more than 2% and less than 15%. Especially, in the present exemplary embodiment, the gloss level of the silver-plated layer formed on the surface of the anode lead portion 62 and the cathode lead portion 63 constituting the bottom surface 70 is set in the range of 0.3 to 1.0, and part of the bottom surface 70 and the wall surface 80 are configured with the white resin, thereby improving the efficiency of extraction of the light, namely the light emitting efficiency compared to a device without such configuration.

Figure 4:
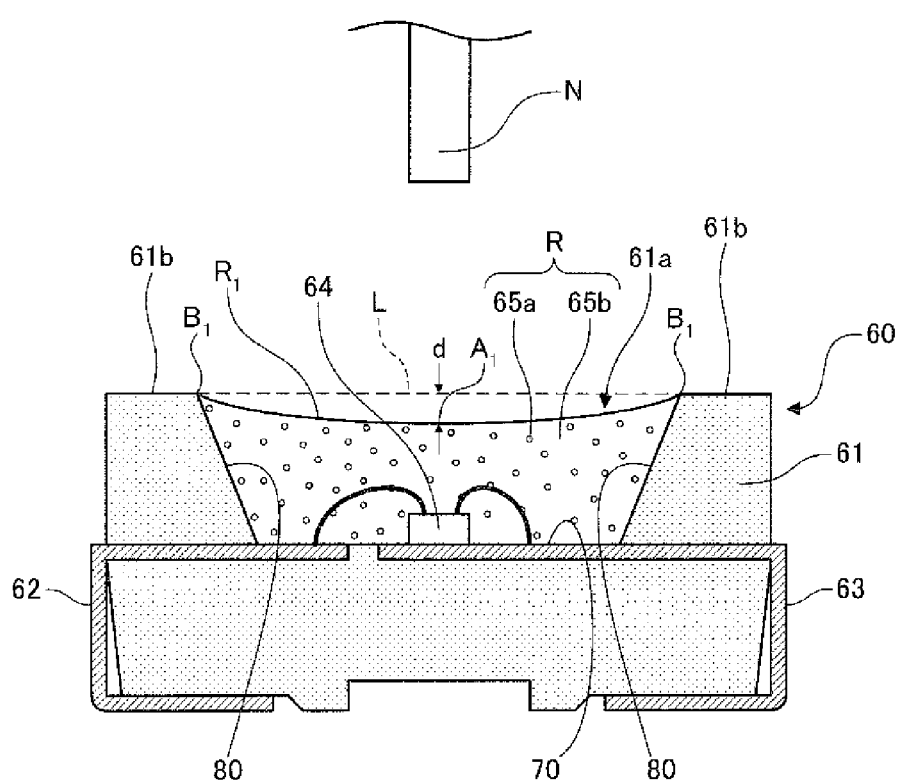
FIG. 4 is a diagram illustrating a manufacturing method of the light emitting unit of the exemplary embodiment 1.

Subsequently, a manufacturing method of the light emitting unit 60 shown in FIGS. 3A and 3B will be described with reference to FIG. 4.

First, injection molding of the white resin is conducted on the lead frame in which the anode lead portion 62 and the cathode lead portion 63 are integrated to form the resin container 61 provided with the recessed portion 61a. Next, the semiconductor light emitting element 64 is bonded and fixed on the cathode lead portion 63 exposed on the bottom surface 70 of the recessed portion 61a in the resin container 61, and the p-electrode and the n-electrode of the semiconductor light emitting element 64 are connected to the anode lead portion 62 and the cathode lead portion 63, respectively, by the bonding wire.

Next, the recessed portion 61a is filled with a mixed resin paste R that contains the phosphor powder 65a and the transparent resin 65b in an uncured state. On that occasion, the semiconductor light emitting element 64 and the bonding wire are covered with the mixed resin paste R, a liquid surface $R_1$ of the mixed resin paste R is recessed below a top surface 61b, and the amount of recessing d is set within a range of −20 µm to −100 µm from the top surface 61b. For instance, in the example shown in FIG. 4, the difference between the height of a central portion $A_1$ of the liquid surface $R_1$ and the height of an edge portion $B_1$ of the liquid surface $R_1$ is set in the range of 20 µm to 100 µm.

The filling of the recessed portion 61a of the resin container 61 with the mixed resin paste R may be performed by a potting system using a discharge device of the paste. The discharge device is configured to include a discharge nozzle N that discharges the mixed resin R and a control portion not shown in the figure.

The mixed resin paste R is generated by mixing the phosphor powder 65a that has a true density in a range of 3 g/cm$^3$ to 4.7 g/cm$^3$ inclusive and mass mean diameter in a range of 7 µm to 15 µm inclusive into the transparent resin 65b in the uncured state, and a viscosity thereof is adjusted to fall in a range of 4000 cP to 15000 cP.

Here, assuming a case where an empty capacity of the recessed portion 61a, to which the semiconductor light emitting element 64 is attached, is 6.5 µL, and that a repeat accuracy of an injection amount of the mixed resin paste R is, for example, ±0.2 µL, and if the injection amount ranges by 0.2 µL, the height of the central portion $A_1$ of the liquid surface $R_1$ of the mixed resin paste R after injection ranges about 25 µm. And, in the case where the height of the liquid surface $R_1$ ranges, for example, by 100 µm, a chromaticity y of emission color of light emitted from the emitting surface 65c ranges by 0.01, and thereby the variations of the chromaticity y in response to the fluctuations of injection amount result in ±0.0025.

It should be noted that the injection amount of the mixed resin paste R is controlled by the injection pressure, and if the injection pressure ranges by a minimum adjustment amount, the injection amount varies on the order of about 0.3 µL. This corresponds to movement of the height of the liquid surface $R_1$ by 38 µm. If a control width of the chromaticity y of the emission color of the light emitting unit 60 is set to ±0.008, in the state where the liquid surface $R_1$ after injection is moved by the change in the viscosity of the mixed resin paste R, it is required to control the injection pressure to change the injection amount, thereby controlling the level of the liquid surface $R_1$ to ±40 μm. It should be noted that the height of the liquid surface $R_1$ can be measured by the aforementioned laser displacement gage (for example, ZSHLD2 manufactured by OMRON Corporation). At this time, a distance between a middle point of connection between the edge portions $B_1$ of the recessed portion 61a and the liquid surface $R_1$ after injection is measured. Before conducting a post-injection thermal curing process, the height of the liquid surface $R_1$ is measured and the injection pressure may be controlled so that the position thereof falls in a of −20 μm to −100 μm from the middle point that connects the edge portions $B_1$ of the recessed portion 61a.

Next, the sealing resin 65 is formed by curing the mixed resin paste R. As the curing process, for example, heating may be conducted. Thereafter, cutting for separating the lead frame into the anode lead portion 62 and the cathode lead portion 63, and bending of the lead frame are carried out to obtain the light emitting unit 60.

Here, the reason why the amount of recessing d of the sealing resin 65 formed in the recessed portion 61a of the resin container 61 of the light emitting unit 60 and the true density and the mass mean diameter of the phosphor powder 65a constituting the sealing resin 65 are limited to the above-described range will be described.

In the case where the plural light emitting units 60 described above are used as the backlight of the liquid crystal display device, it is required that variations on the chromaticity coordinates (x, y) of the emission color outputted by each light emitting unit 60 is kept within a range of ±0.008 in order to suppress the chromaticity distribution of emission color of the backlight. Further, in the case of continuous lighting of the light emitting units 60 for a long time, the emission color changes over time to cause the variation in the chromaticity of the emission color during use, which is also required to be suppressed at the same time.

The present inventors have found that, in the sealing resin 65 of the light emitting unit 60, it is possible to suppress the deviation from the target chromaticity by uniformly dispersing the phosphor powder 65a in the transparent resin 65b. As determinants of the chromaticity of white color in the light emitted from the light emitting unit 60, three types of determinants: the density of the phosphor powder 65a in the sealing resin 65; the ratio of the green phosphor and the red phosphor; and the shape of the emitting surface 65c of the sealing resin 65 to be formed, are considered. Accordingly, the cause of variations in the emission color of the light emitting unit 60 is the differences in the density of the phosphor powder 65a depending on locations in the sealing resin 65, the shift of the ratio between the green phosphor and the red phosphor depending on locations, or change in the shape of the emitting surface 65c of the sealing resin 65 formed in the recessed portion 61a of the resin container 61, which causes the change in the chromaticity of light emitted by the light emitting unit 60, thus generating non-uniformity of color. Besides, in the manufacture of the light emitting unit 60, as long as the phosphor powder 65a contained in the mixed resin paste R sinks down to the bottom surface 70 side after the mixed resin paste R is injected into the recessed portion 61a of the resin container 61, the variations in the density of the phosphor powder 65a in the sealing resin 65 and the variations in the ratio between the green phosphor and the red phosphor are generated.

Accordingly, it is important to improve uniform dispersibility of the phosphor powder 65a in the sealing resin 65 to stabilize the chromaticity of light emitted from the light emitting unit 60. Further, in the case where uniform dispersion of the phosphor powder 65a in the sealing resin 65 is achieved, the chromaticity significantly varies depending upon the shape of the emitting surface 65c of the sealing resin 65; therefore, if the control of the shape of the emitting surface 65c is not performed together with the control of the uniform dispersion, there is a possibility of causing significant variations in the chromaticity, on the contrary, by uniformly dispersing the phosphor powder 65a. Besides, even though the phosphor powder 65a is uniformly dispersed in the sealing resin 65, the output and chromaticity of light emitted from the light emitting unit 60 are affected by the size and shape of the recessed portion 61a of the resin container 61 and the surface conditions of the bottom surface 70 or the wall surface 80. Whereas, the present inventors have found that it is important to impart the reflection property close to the Lambertian reflection to the silver-plated layer of the anode lead portion 62 and the cathode lead portion 63 largely occupying the bottom surface 70 of the recessed portion 61a for eliminating the variations in the emission color depending upon the positions in the emitting surface 65c as well as reducing the light absorption.

Moreover, in the manufacturing method of the light emitting unit 60 as described above, if the phosphor powder 65a sinks down until the transparent resin 65b is cured after the mixed resin paste R is injected into the recessed portion 61a of the resin container 61, it is substantially impossible to make the same way of sinking of the phosphor powder 65a in each of the plural light emitting units 60. Consequently, it is desirable that the green phosphor and the red phosphor contained in the phosphor powder 65a are dispersed in the transparent resin 65b uniformly as possible to cause the plural light emitting units 60 to emit light with emission color of almost the same chromaticity.

In manufacturing of the light emitting unit 60, it is possible to stir the mixed resin paste R, namely the transparent resin 65 containing the phosphor powder 65a in the uncured state until the time of potting thereof into the recessed portion 61a of the resin container 61, but generally it requires on the order of one hour from the time of potting to cure the transparent resin 65 in the uncured state by heating. During this time, the phosphor powder 65a sinks down in the recessed portion 61a in some cases.

Incidentally, sedimentation speed Vs of the phosphor powder 65a in the transparent resin 65b in the uncured state follows the Stokes' formula (1) described below. In the formula (1), $D_p$ denotes the mass mean diameter of the phosphor powder 65a, $\rho_p$ denotes the true density of the phosphor powder 65a, and $\rho_f$ denotes the density of the transparent resin 65b. The sign g denotes the acceleration of gravity and η denotes the viscosity of the transparent resin 65b in the uncured state.

$$Vs = D_p^2(\rho_p - \rho_f)g/18\eta \quad (1)$$

Here, in the mixed resin paste R potted in the recessed portion 61a, the viscosity η of the transparent resin 65b before being cured is increased to reduce the sedimentation speed Vs so that the phosphor powder 65a hardly sinks, but the viscosity η becomes too high, it is difficult to carry out quantitative potting.

Moreover, if the mass mean diameter $D_p$ of the phosphor powder 65a is reduced, the sedimentation speed Vs is lowered, but if the mass mean diameter $D_p$ of the phosphor powder 65a is too small, then it becomes difficult to maintain light-emitting property of the phosphor powder 65a.

Further, if the true density $\rho_p$ of the phosphor powder 65a is equal to the density of the transparent resin 65b, the phosphor powder 65a does not sink; however, the true density of the phosphor powder 65a is more than 2.0 g/cm$^3$ because most phosphor powder 65a contains heavy metal, whereas the true density of the transparent resin 65b in the uncured state is of the order of 1.4 g/cm$^3$ to 1.8 g/cm$^3$.

As described above, it is concluded that there is a difficulty in preventing sedimentation of the phosphor powder 65a by clearing only one of the three properties: the mass mean diameter $D_p$ of the phosphor powder 65a; the true density $\rho_p$ of the phosphor powder 65a; and the viscosity $\eta$ of the transparent resin 65b in the uncured state. In other words, it is necessary to use the transparent resin 65b having high viscosity $\eta$ in a range capable of being quantitatively injected by potting, and select the phosphor powder 65a having a particle diameter as small as possible in a range capable of maintaining the light-emitting property and a true density as low as possible in a range capable of maintaining the light-emitting property.

In the case where the thickness of the sealing resin 65 of the light emitting unit 60 shown in FIGS. 3A and 3B is of the order of 0.5 mm, if the phosphor powder 65a sinks down 0.5 mm in one hour during which the uncured transparent resin 65b is cured, all of the phosphor powder 65a sinks down to the bottom of the recessed portion 61a. Accordingly, if the segmentation distance of the phosphor powder 65a is to be limited in a negligible range for the purpose of suppressing variations in the chromaticity, it is required to adjust the segmentation distance in one hour to be equal to or less than 0.05 mm. To be within the segmentation distance, it is necessary to set the mass mean diameter $D_p$ of the phosphor powder 65a, the true density $\rho_p$ of the phosphor powder 65a, and the viscosity $\eta$ of the transparent resin 65b in the uncured state in the above-described range.

Besides, one of the causes for generating variations in the chromaticity of emission color emitted from the light emitting unit 60 is the amount of the mixed resin paste R injected to form the sealing resin 65. In the case of the light emitting unit 60 as shown in FIGS. 3A and 3B, which is a so-called top-view package, the shape of the emitting surface 65c of the sealing resin 65 to be obtained varies depending upon the amount of injected mixed resin paste R. To describe specifically, there is a case where the sealing resin 65 swells so as to be in a protruding state on the top surface 61b of the resin container 61, and a case of depressing in a recessed state. In the case where the mixed resin paste R injected in the recessed portion 61a swells into the protruding state, since the amount of phosphor powder 65a that effectively operates in wavelength conversion increases, the function, which is similar to that of the case where the density of the phosphor powder 65a is increased, is activated, and thereby the chromaticity of the emission color is shifted to be large in both x-value and y-value. However, if the sealing resin 65 swells into the protruding state, it is difficult to handle in the manufacturing process because the sealing resins 65 stick to each other when being transported by a parts feeder or the like. Accordingly, it is desirable to prevent the sealing resin 65 from swelling into the protruding state. This is also a reason why it is desired to make each sealing resin 65 to depress into the recessed state in the resin container 61. Besides, even though the sealing resin 65 depresses into the recessed state in the resin container 61, the chromaticity of output light emitted from the emitting surface 65c varies depending upon the extent of depression. Upon measurement of a correlation by the present inventors, it has been found that, as the amount of recessing d fluctuates by 100 μm, the y-value of the chromaticity varies by 0.01. In the case of the backlight of the liquid crystal display device, it is required to set both x-value and y-value in the range of ±0.008 inclusive, and therefore the amount of recessing d of the sealing resin 65 should be set within the range of −20 μm to −100 μm.

Based on the above-described matters, in the present exemplary embodiment, the mass mean diameter $D_p$ of the phosphor powder 65a is set in the range of 7 μm to 15 μm inclusive as well as the true density $\rho_p$ of the phosphor powder 65a is set in the range of 3 g/cm$^3$ to 4.7 g/cm$^3$ inclusive. Further, the amount of recessing d of the sealing resin 65 formed in the recessed portion 61a of the resin container 61 is set within the range of −20 μm to −100 μm.

As described so far, according to such a light emitting unit 60, the phosphor powder 65a can be uniformly dispersed in the transparent resin 65b because the sealing resin 65 that covers the semiconductor light emitting element 64 is configured by mixing the phosphor powder 65a having the true density and the mass mean diameter within the predetermined range into the transparent resin 65b. As a result, in each of the light emitting units 60, the white light in which the width of the chromaticity y is controlled within the range of ±0.008 can be emitted.

Moreover, in the light emitting unit 60 of the present exemplary embodiment, the emitting surface 65c of the sealing resin 65 is recessed below the top surface 61b and the amount of recessing d is set within the range of −20 μm to −100 μm, thereby it is capable of setting the width of the chromaticity y of the white lights emitted from plural light emitting units 60 within the range of ±0.008.

Further, according to the aforementioned manufacturing method of the light emitting unit 60, the phosphor powder 65a having the true density and the mass mean diameter within the above-described range is mixed into the uncured transparent resin 65b to obtain the mixed resin paste R of the predetermined viscosity, and this is filled to cover the semiconductor light emitting element 64 and then cured to form the sealing resin 65, thus making it possible to uniformly disperse the phosphor powder 65a into the transparent resin 65b. Moreover, the emitting surface 65c is recessed below the top surface 61b and the amount of recessing d is set within the range of −20 μm to −100 μm from the top surface 61b, thus making it possible to configure the light emitting unit 60 capable of emitting the white light that is homogeneous with less non-uniformity of color from the emitting surface 65c of the sealing resin 65.

Exemplary Embodiment 2

Figure 5A:
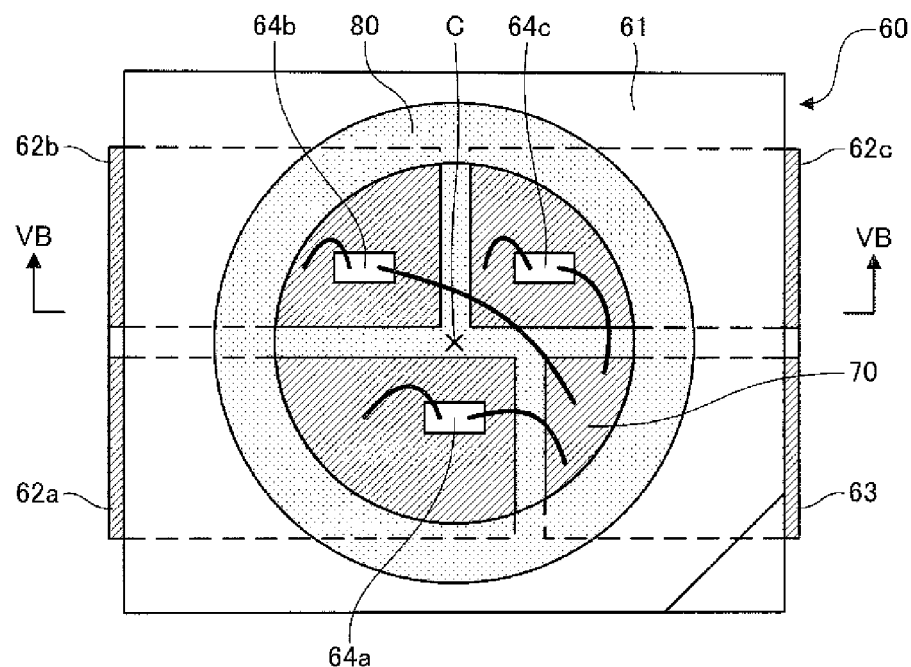
FIGS. 5A and 5B are diagrams illustrating a configuration of a light emitting unit of the exemplary embodiment 2.
Figure 5B:
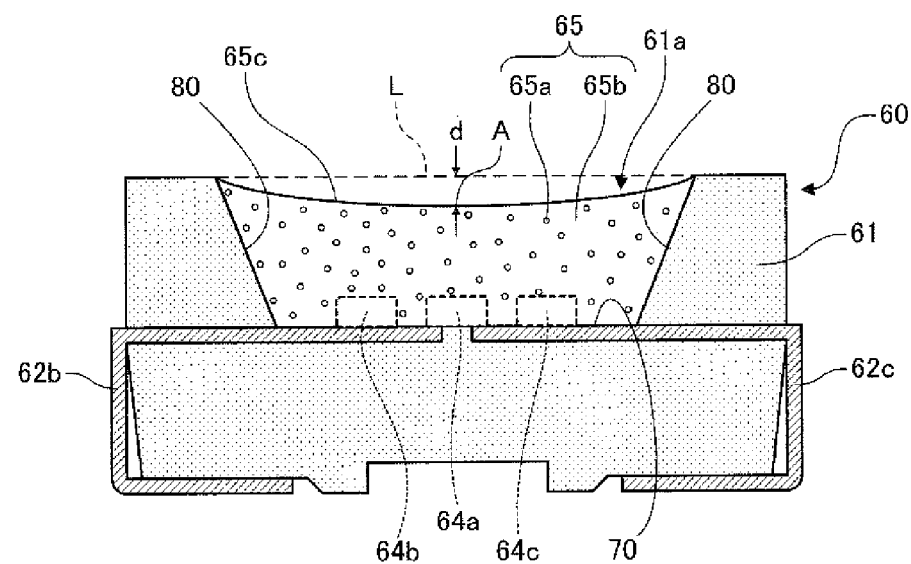

FIGS. 5A and 5B are diagrams illustrating a configuration of the light emitting unit 60 of the present exemplary embodiment. Here, FIG. 5A is a top view of the light emitting unit 60, and FIG. 5B is a VB-VB cross-sectional view of FIG. 5A.

This light emitting unit 60 includes a resin container 61 in which a recessed portion 61a is formed on an upper portion side thereof, a first anode lead portion 62a, a second anode lead portion 62b, a third anode lead portion 62c and a cathode lead portion 63 formed by a lead frame integrated with the resin container 61, a first semiconductor light emitting element 64a, a second semiconductor light emitting element 64b and a third semiconductor light emitting element 64c attached to a bottom surface 70 of the recessed portion 61a and a sealing resin 65 provided to cover the recessed portion 61a. It should be noted that the sealing resin 65 is omitted in FIG. 5A.

The resin container 61 is formed by injection molding of a thermoplastic resin containing a white pigment (referred to as a white resin in the following description) over a metal lead portion including the first anode lead portion 62a, the second anode lead portion 62b, the third anode lead portion 62c and the cathode lead portion 63.

With respect to the white resin constituting the resin container 61, the one described in the exemplary embodiment 1 can be used.

The recessed portion 61a provided in the resin container 61 includes a bottom surface 70 having a circular shape and a wall surface 80 that rises up from an edge around the bottom surface 70 so as to open toward the upper portion side of the resin container 61. Here, the bottom surface 70 is configured with the first anode lead portion 62a, the second anode lead portion 62b, the third anode lead portion 62c and the cathode lead portion 63 exposed at the recessed portion 61a and the white resin of the resin container 61 that exposes at a clearance among the first anode lead portion 62a, the second anode lead portion 62b, the third anode lead portion 62c and the cathode lead portion 63. However, the region equal to or more than half of the bottom surface 70 is occupied by the first anode lead portion 62a, the second anode lead portion 62b, the third anode lead portion 62c and the cathode lead portion 63. On the other hand, the wall surface 80 is configured by the white resin that constitutes the resin container 61. It should be noted that the shape of the bottom surface 70 may be any of a circle, a rectangle, an ellipse and a polygon. Moreover, the shape of the wall surface 80 may be any of a circle, a rectangle, an ellipse and a polygon, which may be the same as the shape of the bottom surface, or may be different as in the present exemplary embodiment.

The first anode lead portion 62a, the second anode lead portion 62b, the third anode lead portion 62c and the cathode lead portion 63 as an example of a conductor portion are holded while part of each being caught in the resin container 61 and the other part of each being exposed to the outside of the resin container 61 to serve as a terminal for applying a current to each of a first semiconductor light emitting element 64a, a second semiconductor light emitting element 64b and a third semiconductor light emitting element 64c. On the premise of the surface mount technology, as shown in FIGS. 5A and 5B, it is preferable to bend each of the first anode lead portion 62a, the second anode lead portion 62b, the third anode lead portion 62c and the cathode lead portion 63 toward the back side of the resin container 61 so as to provide a tip end thereof on a bottom portion of the resin container 61.

Further, the first anode lead portion 62a, the second anode lead portion 62b, the third anode lead portion 62c and the cathode lead portion 63, namely the lead frame, is a metal plate having a thickness of the order of 0.1 mm to 0.5 mm, a base thereof being a metal conductor such as a copper alloy or the like, and a silver-plated layer being formed on a surface thereof by silver plating. Accordingly, on the bottom surface 70 of the recessed portion 61a, the silver-plated layer of each of the first anode lead portion 62a, the second anode lead portion 62b, the third anode lead portion 62c and the cathode lead portion 63 is exposed. It is preferable that the light reflectance of the first anode lead portion 62a, the second anode lead portion 62b, the third anode lead portion 62c and the cathode lead portion 63, namely the light reflectance of the silver-plated layer is 85% to 98% inclusive. Also, the gloss level of the first anode lead portion 62a, the second anode lead portion 62b, the third anode lead portion 62c and the cathode lead portion 63 within the range of 0.3 to 1.0 inclusive is preferable, and the range of 0.5 to 0.7 inclusive is more preferable. Here, the gloss level is prescribed in JISZ8741 and assumed to be a value in the case where an incident angle of the incident light is 60°.

The first semiconductor light emitting element 64a, the second semiconductor light emitting element 64b and the third semiconductor light emitting element 64c are bonded on the first anode lead portion 62a, the second anode lead portion 62b and the third anode lead portion 62c all exposed at the bottom surface 70, respectively, by die bonding adhesive made of silicone resin or epoxy resin to be fixed.

Here, each of the first semiconductor light emitting element 64a, the second semiconductor light emitting element 64b and the third semiconductor light emitting element 64c has an n-electrode and a p-electrode. The p-electrode of the first semiconductor light emitting element 64a, the p-electrode of the second semiconductor light emitting element 64b and p-electrode of the third semiconductor light emitting element 64c are connected to the first anode lead portion 62a, the second anode lead portion 62b and the third anode lead portion 62c, respectively, via a bonding wire. On the other hand, the n-electrodes provided to the respective first semiconductor light emitting element 64a, second semiconductor light emitting element 64b and third semiconductor light emitting element 64c are connected to the common cathode lead portion 63. Accordingly, in the light emitting unit 60, the first semiconductor light emitting element 64a, the second semiconductor light emitting element 64b and the third semiconductor light emitting element 64c are connected in parallel.

Further, in the light emitting unit 60, the first semiconductor light emitting element 64a, the second semiconductor light emitting element 64b and the third semiconductor light emitting element 64c are arranged in respective positions deviated from a center C of the bottom surface 70 having the circular shape.

The first semiconductor light emitting element 64a emits blue light having a main emission peak in the wavelength region of 430 nm to 500 nm inclusive, and includes at least a seed layer made of AlN formed on a sapphire substrate, a foundation layer formed on the seed layer and a laminated semiconductor layer anchored by GaN. The laminated semiconductor layer is configured by laminating the foundation layer, an n-type semiconductor layer, a light emitting layer and a p-type semiconductor layer in this order from the substrate side. It should be noted that the second semiconductor light emitting element 64b and the third semiconductor light emitting element 64c have a configuration identical to that of the first semiconductor light emitting element 64a and output the blue light.

The sealing resin 65 is configured with a phosphor (hereinafter, also referred to as phosphor powder) 65a including at least two types, which absorbs light emitted from the first semiconductor light emitting element 64a, the second semiconductor light emitting element 64b and the third semiconductor light emitting element 64c, and then emits light of longer wavelength, and a transparent resin 65b that contains the phosphor powder 65a in a uniformly dispersed state. In this example, the phosphor powder 65a includes a green phosphor that absorbs the blue light emitted from the first semiconductor light emitting element 64a, the second semiconductor light emitting element 64b and the third semiconductor light emitting element 64c and then emits green light, and a red phosphor that absorbs the blue light emitted from the first semiconductor light emitting element 64a, the second semiconductor light emitting element 64b and the third semiconductor light emitting element 64c and then emits red light. It should be noted that the red phosphor is also excited by the light emitted by the green phosphor; therefore movement of chromaticity of the light emitted by the light emitting unit 60 varies complicatedly depending upon the ratio between the green and red phosphors. To the adjustment of such chromaticity, related are the emission wavelength of the first semiconductor light emitting element 64a, the second semiconductor light emitting element 64b and the third semiconductor light emitting element 64c, the ratio between the green phosphor and the red phosphor, the density of phosphor in the sealing resin 65 and a shape of the top surface of the sealing resin 65, namely an emitting surface 65c from which the light is emitted.

In the light emitting unit 60, owing to the blue light emitted by the first semiconductor light emitting element 64a, the second semiconductor light emitting element 64b and the third semiconductor light emitting element 64c, the green light emitted by the green phosphor contained in the phosphor powder 65a and the red light emitted by the red phosphor similarly contained in the phosphor powder 65a, three primary colors of blue, green and red are completed. Consequently, white light is emitted from the emitting surface 65c of the sealing resin 65. The color reproduction range in the case where this white light is used for the backlight of the liquid crystal display device is determined by the wavelength of the main emission peak and a half width of the first semiconductor light emitting element 64a, the second semiconductor light emitting element 64b and the third semiconductor light emitting element 64c and the wavelength of the emission peak and a half width of the phosphor powder 65a.

It should be noted that, with respect to the above-described green phosphor and red phosphor constituting the phosphor powder 65a, those described in the exemplary embodiment 1 can be used.

On the other hand, as the transparent resin 65b composing the sealing resin 65, various kinds of resin that is transparent in the visible region may be applied, but from the viewpoint of heat-resistivity, it is preferable to use silicone resin.

Further, in the sealing resin 65, the emitting surface 65c for emitting white light is provided. In this example, as shown in FIG. 5B, the emitting surface 65c is formed on the upper portion side of the resin container 61, namely the opening portion side of the recessed portion 61a.

In this light emitting unit 60, similar to the exemplary embodiment 1 and as shown in FIG. 5B, the central portion of the emitting surface 65c is recessed below the top surface of the resin container 61, and the amount of recessing d is set within the range of −20 μm to −100 μm from the top surface.

Then, description will be given to light emitting operation of the light emitting unit 60 shown in FIGS. 5A and 5B.

When a current is fed to the first semiconductor light emitting element 64a, the second semiconductor light emitting element 64b and the third semiconductor light emitting element 64c while regarding the first anode lead portion 62a, the second anode lead portion 62b and the third anode lead portion 62c as a positive electrode and the cathode lead portion 63 as a negative electrode, the first semiconductor light emitting element 64a, the second semiconductor light emitting element 64b and the third semiconductor light emitting element 64c emit blue light. The blue light emitted by the first semiconductor light emitting element 64a, the second semiconductor light emitting element 64b and the third semiconductor light emitting element 64c proceeds within the sealing resin 65, and is emitted from the emitting surface 65c to the outside directly or after being reflected by the bottom surface 70 or the wall surface 80. However, part of the light heading for the emitting surface 65c is reflected by the emitting surface 65c and proceeds within the sealing resin 65 again.

During this time, in the sealing resin 65, part of the blue light is converted into the green light and the red light by the phosphor powder 65a, and the converted green light and red light are emitted from the emitting surface 65c to the outside together with the blue light directly or after being reflected by the bottom surface 70 or the wall surface 80. Consequently, the white light including the blue light, the green light and the red light is emitted from the emitting surface 65c.

In the case where the phosphor powder 65a is uniformly dispersed in the transparent resin 65b in the sealing resin 65 and the sealing resin 65 is contained in the recessed portion 61a of the resin container 61 made of white resin whose light reflectance is from 85% to 98% inclusive, as the light emitting unit 60 in the present exemplary embodiment, the behavior of light will be described as follows. For example, among the light outputted from the first semiconductor light emitting element 64a, the second semiconductor light emitting element 64b and the third semiconductor light emitting element 64c, the light incident on the white resin constituting the wall surface 80 and the bottom surface 70 moves complicatedly to travel back and forth many times, such that the light is reflected and returned to the sealing resin 65 and then incident on the white resin again, and finally, passes through the sealing resin 65 and exits to the emitting surface 65c. In this case, the manner of reflection and the light absorption coefficient of the silver-plated layer provided on the bottom surface 70 have a large influence. In the present exemplary embodiment, the reflection property of a so-called Lambertian reflection type is provided to the silver-plated layer and the white resin constituting the bottom surface 70 and the wall surface 80, thus reducing the amount of light absorbed into the silver-plated layer and the white resin constituting the bottom surface 70 and the wall surface 80 compared to the case where these are provided with a reflection property of a so-called mirror reflection type. Consequently, the reason why there appears a difference in the amount of light outputted by the light emitting unit 60, namely brightness, between the reflection property of the Lambertian reflection type and the reflection property of mirror reflection type is due to the difference in the light absorption coefficient in the bottom surface 70 or the wall surface 80; if it is assumed that the light absorption coefficient is zero, there occurs no difference in the output. Sensuously, it seems that the light outputted from the first semiconductor light emitting element 64a, the second semiconductor light emitting element 64b and the third semiconductor light emitting element 64c can be led to the emitting surface 65c with smaller number of reflections by providing the reflection property of the mirror reflection type to the bottom surface 70 or the wall surface 80 constituting the recessed portion 61a. However, in reality, the amount of light absorbed into the bottom surface 70 or the wall surface 80 can be reduced by providing the reflection property of the Lambertian reflection type to the bottom surface 70 or the wall surface 80 because there exists the complicated light behavior as described above.

Among these, the light heading for the bottom surface 70 or the wall surface 80 repeats reflections by the silver-plated layer or the white resin constituting the bottom surface 70 or the wall surface 80 and finally exits to the emitting surface 65c. In contrast, the light heading for the emitting surface 65c is related to the reflection by the bottom surface 70 or the wall surface 80. That is, the part of the light does a repeat of being diffused by the phosphor powder 65a dispersed in the sealing resin 65, being reflected by the white resin constituting the wall surface 80 and being reflected again by the silver-plated layer or the white resin of the bottom surface 70, and thereafter exits to the emitting surface 65c. During the process of such diffusions and reflections, absorption of light occurs though only gradually. To effectively extract the light outputted by the first semiconductor light emitting element 64a, the second semiconductor light emitting element 64b and the third semiconductor light emitting element 64c, the number of diffusions or reflections of the light should be small. However, from the viewpoint of suppressing variations in the chromaticity depending upon the positions on the emitting surface 65c, the diffusions and the reflections should be repeated. As discussed above, a contradictory idea of effectively extracting the light outputted from the first semiconductor light emitting element 64a, the second semiconductor light emitting element 64b and the third semiconductor light emitting element 64c while eliminating the variations in the chromaticity in each direction is required in actuality.

On such a demand, in the present exemplary embodiment, the resin container 61 is configured with a white resin that absorbs less light and the silver-plated layer is formed on the surface of the first anode lead portion 62a, the second anode lead portion 62b, the third anode lead portion 62c and the cathode lead portion 63 constituting the lead frame, thus reducing the light absorption coefficient of the visible light in the recessed portion 61a. Specifically, the light absorption coefficient of the silver-plated layer and the white resin constituting the bottom surface 70 and the wall surface 80 in the visible region is set in a range that is more than 2% and less than 15%. Especially, in the present exemplary embodiment, the gloss level of the silver-plated layer formed on the surface of the first anode lead portion 62a, the second anode lead portion 62b, the third anode lead portion 62c and the cathode lead portion 63 constituting the bottom surface 70 is set in the range of 0.3 to 1.0, and the wall surface 80 is configured with the white resin, thereby improving the efficiency of extraction of the light, namely the light emitting efficiency, compared to a device without such configuration.

Figure 6:
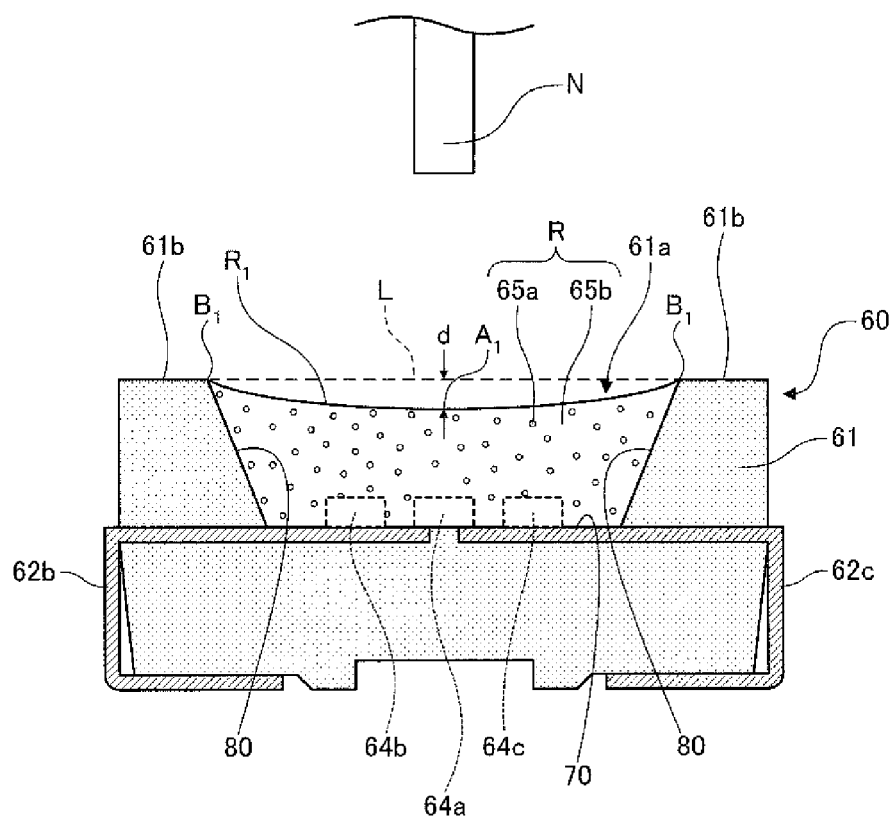
FIG. 6 is a diagram illustrating a manufacturing method of the light emitting unit of the exemplary embodiment 2.

Subsequently, a manufacturing method of the light emitting unit 60 shown in FIGS. 5A and 5B will be described with reference to FIG. 6.

First, injection molding of the white resin is conducted on the lead frame in which the first anode lead portion 62a, the second anode lead portion 62b, the third anode lead portion 62c and the cathode lead portion 63 are integrated to form the resin container 61 provided with the recessed portion 61a. Next, the first semiconductor light emitting element 64a, the second semiconductor light emitting element 64b and the third semiconductor light emitting element 64c are bonded and fixed on the first anode lead portion 62a, the second anode lead portion 62b and the third anode lead portion 62c exposed on the bottom surface 70 of the recessed portion 61a in the resin container 61, respectively. Then, by using a bonding wire, the p-electrode of the first semiconductor light emitting element 64a, the p-electrode of the second semiconductor light emitting element 64b and the p-electrode of the third semiconductor light emitting element 64c are connected to the first anode lead portion 62a, the second anode lead portion 62b and the third anode lead portion 62c respectively, while the n-electrodes of the first semiconductor light emitting element 64a, the second semiconductor light emitting element 64b and the third semiconductor light emitting element 64c are connected to the cathode lead portion 63 respectively, by using a bonding wire.

Next, the recessed portion 61a is filled with a mixed resin paste R that contains the phosphor powder 65a and the transparent resin 65b in an uncured state. On that occasion, the first semiconductor light emitting element 64a, the second semiconductor light emitting element 64b, the third semiconductor light emitting element 64c and the bonding wire are covered with the mixed resin paste R, a liquid surface $R_1$ of the mixed resin paste R is recessed below the top surface 61b, and the amount of recessing d is set within a range of −20 μm to −100 μm from the top surface 61b. For instance, in the example shown in FIG. 5B, the difference between the height of a central portion $A_1$ of the liquid surface $R_1$ and the height of an edge portion $B_1$ of the liquid surface $R_1$ is set in the range of 20 μm to 100 μm.

The filling of the recessed portion 61a of the resin container 61 with the mixed resin paste R may be performed by a potting system using a discharge device of the paste. The discharge device is configured to include a discharge nozzle N that discharges the mixed resin R and a control portion not shown in the figure.

The mixed resin paste R is generated by mixing the phosphor powder 65a that has a true density in a range of 3 g/cm$^3$ to 4.7 g/cm$^3$ inclusive and mass mean diameter in a range of 7 μm to 15 μm inclusive into the transparent resin 65b in the uncured state, and a viscosity thereof is adjusted to fall in a range of 4000 cP to 15000 cP.

Here, assuming a case where an empty capacity of the recessed portion 61a, to which the first semiconductor light emitting element 64a, the second semiconductor light emitting element 64b and the third semiconductor light emitting element 64c are attached, is 6.5 μL and that a repeat accuracy of an injection amount of the mixed resin paste R is, for example, ±0.2 μL, and if the injection amount fluctuates 0.2 μL, the height of the central portion $A_1$ of the liquid surface $R_1$ of the mixed resin paste R after injection fluctuates about 25 μm. And, in the case where the height of the liquid surface $R_1$ moves, for example, by 100 μm, the chromaticity y of emission color of light emitted from the emitting surface 65c varies by 0.01, and thereby the variations of the chromaticity y in response to the fluctuations of injection amount result in ±0.0025.

It should be noted that the injection amount of the mixed resin paste R is controlled by the injection pressure, and if the injection pressure is fluctuated by a minimum adjustment amount, the injection amount varies on the order of about 0.3 μL. This corresponds to movement of the height of the liquid surface $R_1$ by 38 μm. If a control width of the chromaticity y of the emission color of the light emitting unit 60 is set to ±0.008, in the state where the liquid surface $R_1$ after injection is moved by the change in the viscosity of the mixed resin paste R, it is required to control the injection pressure to change the injection amount, thereby controlling the level of the liquid surface $R_1$ to ±40 μm. It should be noted that the height of the liquid surface $R_1$ can be measured by the aforementioned laser displacement gage (for example, ZSHLD2 manufactured by OMRON Corporation). At this time, a distance between a middle point of connection between the edge portions $B_1$ of the recessed portion 61a and the liquid surface $R_1$ after injection is measured. Before conducting a post-injection thermal curing process, the height of the liquid surface $R_1$ is measured and the injection pressure may be controlled so that the position thereof falls in a range of −20 μm to −100 μm from the middle point that connects the edge portions $B_1$ of the recessed portion 61a.

Next, the sealing resin 65 is formed by curing the mixed resin paste R. As the curing process, for example, heating may be conducted. Thereafter, cutting for separating the lead frame into the first anode lead portion 62a, the second anode lead portion 62b, the third anode lead portion 62c and the cathode lead portion 63, and bending of the lead frame are carried out to obtain the light emitting unit 60.

As described so far, according to such a light emitting unit 60, the phosphor powder 65a can be uniformly dispersed in the transparent resin 65b because the sealing resin 65 that covers the first semiconductor light emitting element 64a, the second semiconductor light emitting element 64b and the third semiconductor light emitting element 64c is configured by mixing the phosphor powder 65a having the true density and the mass mean diameter within the predetermined range into the transparent resin 65b. As a result, in each of the light emitting units 60, the white light in which the width of the chromaticity y is controlled within the range of ±0.008 can be emitted.

It should be noted that, if observed from a different viewpoint, this means that it is possible to suppress variations in the emission color irrespective of attaching positions of the first semiconductor light emitting element 64a, the second semiconductor light emitting element 64b and the third semiconductor light emitting element 64c in the bottom surface 70 of the recessed portion 61a. That is, flexibility related to setting of arrangement positions of the first semiconductor light emitting element 64a, the second semiconductor light emitting element 64b and the third semiconductor light emitting element 64c is increased.

Moreover, in the light emitting unit 60 of the present exemplary embodiment, the emitting surface 65c of the sealing resin 65 is recessed below the top surface 61b and the amount of recessing d is set within the range of −20 μm to −100 μm, thereby it is capable of setting the width of the chromaticity y of the white lights emitted from plural light emitting units 60 within the range of ±0.008.

Further, according to the aforementioned manufacturing method of the light emitting unit 60, the phosphor powder 65a having the true density and the mass mean diameter within the above-described range is mixed into the uncured transparent resin 65b to obtain the mixed resin paste R of the predetermined viscosity, and this is filled to cover the first semiconductor light emitting element 64a, the second semiconductor light emitting element 64b and the third semiconductor light emitting element 64c and then cured to form the sealing resin 65, thus making it possible to uniformly disperse the phosphor powder 65a into the transparent resin 65b. Moreover, the emitting surface 65c is recessed below the top surface 61b and the amount of recessing d is set within the range of −20 μm to −100 μm from the top surface 61b, thus making it possible to configure the light emitting unit 60 capable of emitting the white light that is homogeneous with less non-uniformity of color from the emitting surface 65c of the sealing resin 65.

And, in the light emitting unit 60 of the present exemplary embodiment, by being provided with the above-described configuration, it is possible to emit the white light that is homogeneous with less non-uniformity of color from the emitting surface 65c of the sealing resin 65 though, in the bottom surface 70 of the recessed portion 61a, the first semiconductor light emitting element 64a, the second semiconductor light emitting element 64b and the third semiconductor light emitting element 64c are arranged in the positions different from the center C of the bottom surface 70.

Exemplary Embodiment 3

Figure 7A:
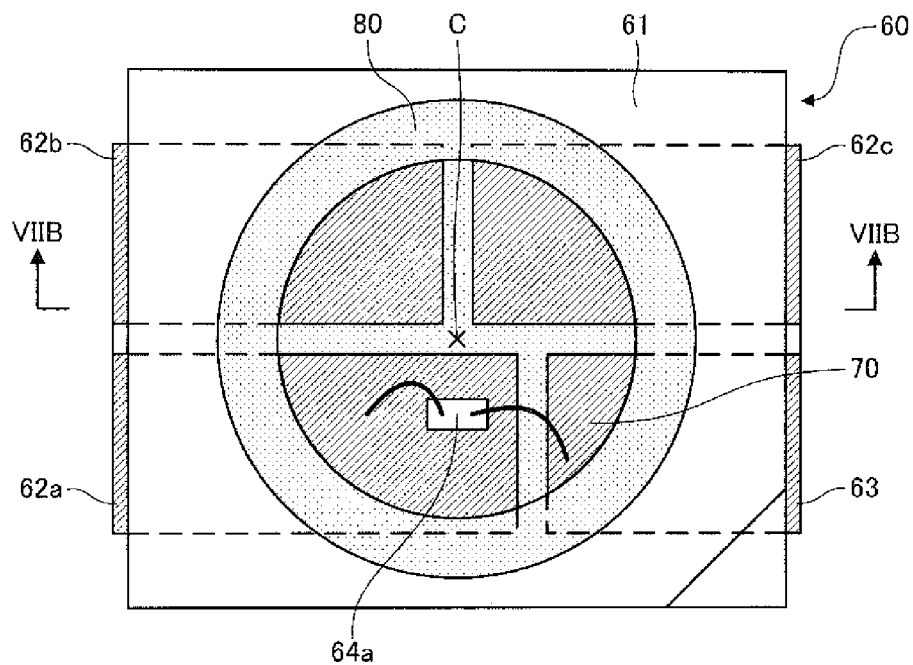
FIGS. 7A and 7B are diagrams illustrating a configuration of a light emitting unit of the exemplary embodiment 3.
Figure 7B:
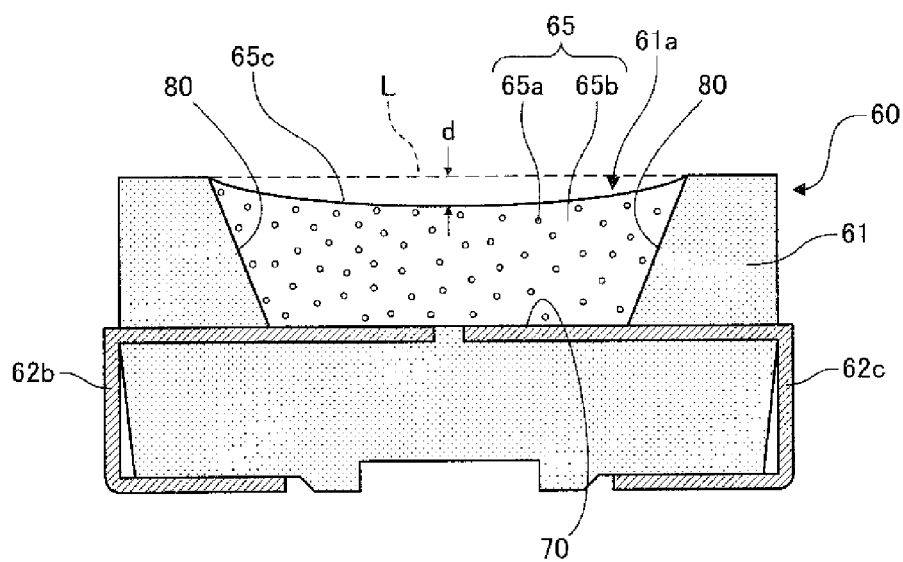

FIGS. 7A and 7B are diagrams illustrating a configuration of the light emitting unit 60 of the present exemplary embodiment. Here, FIG. 7A is a top view of the light emitting unit 60, and FIG. 7B is a VIIB-VIIB cross-sectional view of FIG. 7A.

The basic configuration of the light emitting unit 60 is almost similar to that used in the exemplary embodiment 2. However, in this light emitting unit 60, only the first semiconductor light emitting element 64a is mounted, whereas the second semiconductor light emitting element 64b and the third semiconductor light emitting element 64c are not mounted. Here, similar to the exemplary embodiment 2, the first semiconductor light emitting element 64a is attached to the first anode lead portion 62a exposed on the bottom surface 70, and electrically connected to the first anode lead portion 62a and the cathode lead portion 63.

Further, in the light emitting unit 60, similar to the exemplary embodiment 2, the first semiconductor light emitting element 64a is arranged at a position deviated from the center C of the bottom surface 70 having the circular shape. Such a configuration is adopted in the case where there is a difficulty in arranging the first semiconductor light emitting element 64a at the center C of the bottom surface 70 due to, for example, the shape of the lead frame or performing wire bonding.

Similar to the exemplary embodiment 2, on each surface of the first anode lead portion 62a, the second anode lead portion 62b, the third anode lead portion 62c and the cathode lead portion 63, the silver plating is provided, whose gloss level is preferably from 0.3 to 1.0, and more preferably from 0.5 to 0.7.

Also in the light emitting unit 60 of the present exemplary embodiment, the resin container 61 is configured with a white resin that absorbs less light and the silver-plated layer is formed on the surface of the first anode lead portion 62a, the second anode lead portion 62b, the third anode lead portion 62c and the cathode lead portion 63 constituting the lead frame, to set the light absorption coefficient thereof in the visible region is in a range that is more than 2% and less than 15%. The gloss level of the silver plating formed on the surface of the first anode lead portion 62a, the second anode lead portion 62b, the third anode lead portion 62c and the cathode lead portion 63 constituting the bottom surface 70 is set in the range of 0.3 to 1.0, and the wall surface 80 is configured with the white resin, thereby improving the efficiency of extraction of the light, namely the light emitting efficiency, compared to a device without such configuration.

Further, with the above-described configuration being provided, even though the first semiconductor light emitting element 64a in the bottom surface 70 of the recessed portion 61a is arranged at a position different from the center C of the bottom surface 70, the white light that is homogeneous with less non-uniformity of color can be emitted from the emitting surface 65c of the sealing resin 65.

It should be noted that, in the exemplary embodiments 1 through 3, an example has been described in which the light emitting module 12 configured by using the light emitting unit 60 is applied to the backlight unit 10 of the liquid crystal display device, however, not limited thereto. For example, by combining the light emitting module 12 with a shade or the like, it can also be used as a lighting system for illuminating a space or an object.

Further, the above-described light emitting unit 60 can be applied to, for example, a traffic light, a light source device of a scanner, an exposure device of a printer, in-car lighting equipment, an LED display device using a dot matrix LED or the like.

Moreover, in the exemplary embodiments 1 through 3, an example has been described in which the white light is outputted by the semiconductor light emitting element 64 (the first semiconductor light emitting element 64a, the second semiconductor light emitting element 64b and the third semiconductor light emitting element 64c) that outputs the blue light, a phosphor that converts the blue light into the green light and a phosphor that converts the blue light into the red light, however, not limited thereto. That is, the emission color (emission wavelength) of the semiconductor light emitting element 64 may be appropriately selected, and moreover, the phosphor may be appropriately selected. In the present invention, it is not indispensable that the light emitting unit 60 includes the phosphor, but the light emitted from the semiconductor light emitting element 64 may be directly outputted.

EXAMPLE

Next, an example of the present invention will be described.

FIG. 8 is a diagram showing a relation between each sample and a configuration thereof used in the example and a comparative example.

In this experiment, three types of resin containers 61 with different dimensions were prepared. Here, a first resin container 61 (referred to as Type 1) has a length-to-width size of 3.5 mm×2.8 mm on the top surface, a second resin container 61 (Type 2) has a length-to-width size of 3.8 mm×0.8 mm on the top surface, and a third resin container 61 (Type 3) has a length-to-width size of 5.0 mm×5.5 mm on the top surface. Further, the light absorption coefficient of the white resin constituting the resin containers 61 of Type 1 to Type 3 is 7%. It should be noted that the light emitting units 60 including the resin containers 61 of Type 1 and Type 2 have the configuration shown in FIGS. 3A and 3B, in each of which a single semiconductor light emitting element 64 is mounted. On the other hand, the light emitting unit 60 including the resin container 61 of Type 3 has the configuration shown in FIGS. 5A and 5B, in which three semiconductor light emitting units 64 (the first semiconductor light emitting element 64a, the second semiconductor light emitting element 64b and the third semiconductor light emitting element 64c) are mounted.

Moreover, in this experiment, seven types of lead frame provided with silver plating of different gloss levels were combined with the resin containers 61 of Type 1 to Type 3. It should be noted that the gloss level of the silver plating corresponds to formation of asperity on the surface of the lead frame. Here, a group of samples including the first lead frame having the gloss level of 0.1 (samples S1 to S3) is referred to as Gr. A. Also, a group of samples including the second lead frame having the gloss level of 0.3 (samples S4 to S6) is referred to as Gr. B. Further, a group of samples including the third lead frame having the gloss level of 0.5 (samples S7 to S9) is referred to as Gr. C. Furthermore, a group of samples including the fourth lead frame having the gloss level of 0.6 (samples S10 to S12) is referred to as Gr. D. Furthermore, a group of samples including the fifth lead frame having the gloss level of 0.7 (samples S13 to S15) is referred to as Gr. E. Moreover, a group of samples including the sixth lead frame having the gloss level of 1.0 (samples S16 to S18) is referred to as Gr. F. Furthermore, a group of samples including the seventh lead frame having the gloss level of 1.3 (samples S19 to S21) is referred to as Gr. G. It should be noted that Gr. B to Gr. F, namely the samples S4 to S18 are the examples, and Gr. A, namely the samples S1 to S3 and Gr. G, namely the samples S19 to S21 are comparative examples in this instance.

Here, in Gr. A, the silver-plated layer of the lead frame is in a state of so-called non-glossy white color that has no gloss and shows a property extremely close to the Lambertian reflection. Further, in Gr. B to Gr. F, the silver-plated layer of the lead frame is in a state of semi-glossy, and shows the partial Lambertian reflection property. In contrast, in Gr. G, the silver-plated layer of the lead frame is in a state of so-called full-glossy and shows a property close to the perfect mirror reflection.

Then, preparation procedures of each of the samples S1 to S21 will be briefly described.

The samples S1, S2, S4, S5, S7, S8, S10, S11, S13, S14, S16, S17, S19 and S20 having the resin containers 61 of Type 1 or Type 2 were prepared by forming 144 resin containers 61 with the white resin for a single lead frame. On the other hand, the samples S3, S6, S9, S12, S15, S18 and S21 having the casing of Type 3 were prepared by forming 40 resin containers 61 with the white resin for a single lead frame. It should be noted that, in each of the samples S1 to S21, the depth of the recessed portion 61a of the resin container 61 is all 0.6 mm.

Then, the semiconductor light emitting element 64 was die-bonded on each of the resin containers 61 by using a die attach paste, the die attach paste was cured by heating for two hours at the temperature of 150° C., and wire bonding was performed by using a 4N gold wire having the diameter of 25 μm manufactured by Tanaka Kikinzoku Kogyo. It should be noted that, in the case of having the resin container 61 of Type 1 or Type 2, a single semiconductor light emitting element 64 was mounted on a single resin container 61. In contrast, in the case of having the resin container 61 of Type 3, three semiconductor light emitting elements 64 (the first semiconductor light emitting element 64a, the second semiconductor light emitting element 64b and the third semiconductor light emitting element 64c) were mounted in parallel on a single resin container 61.

Further, the mixed resin paste R was prepared by kneading the phosphor powder 65a containing the silicate phosphor having the density of 4.5 g/cm$^3$, the excitation wavelength of 450 nm, the emission wavelength of 530 nm and the mass mean diameter of 12 μm and the phosphor nitride having the density of 4.2 g/cm$^3$, the excitation wavelength of 460 nm, the emission wavelength of 640 nm and the mass mean diameter of 9 μm into the uncured transparent resin 65b composed of a silicone resin having the viscosity of 9000 cP as of the time of injection and the density of 1.7 g/cm$^3$. Here, the amount of the phosphor powder 65a mixed into the transparent resin 65 was set to 5.8% by mass for the green phosphor and 2.1% by mass for the red phosphor, which were constant.

Then, the mixed resin paste R thus obtained was injected by using the discharge nozzle N of an automatic resin injector. Here, 1.2 μL for Type 1, 3 μL for Type 2, 6.8 μL for Type 3 were injected. In Type 1 and Type 2, 144 resin containers 61 are provided to the single lead frame. As for these, 100 lead frames were prepared and 14400 light emitting units 60 were prototyped in total. On the other hand, in Type 3, 40 resin containers 61 are provided to the single lead frame. As for this, 400 lead frames were prepared and 16000 light emitting units 60 were prototyped in total. It should be noted that it required on the order of 1.5 seconds for injecting the mixed resin paste R into the single resin container 61.

With respect to each light emitting unit 60, the shape of the top surface of the emitting surface 65c was measured by the above-described laser displacement gage. Before starting, a dummy was injected and the amount of injection was finely adjusted so that an average value of the 10 amounts of recessing d (average recessing amount) would be −60 μm±10 μm. If the average recessing amount of one lead frame was deviated by equal to or more than 20 μm, the injection pressure was varied for adjusting to be −60 μm±10 μm. The fluctuations in one lead frame was σ=about 16 μm in the case of Type 1, σ=about 13 μm in the case of Type 2 and σ=about 11 μm in the case of Type 3.

Here, the smaller the injection amount of the mixed resin paste R, the larger the fluctuations, but, if being averaged in one lead frame, the amount of recessing d moved in almost the same manner with the lapse of time. As a result, the amount of recessing d could be −20 μm to −100 μm with any of resin containers 61. After the injection of the mixed resin paste R, heat was applied for four hours at 150° C. to execute the thermal curing process.

Then, for each obtained light emitting unit 60, an output P (mW), a total luminous flux φ (lm), the light emitting efficiency (lm/W) and the chromaticity (x, y) were measured. Here, in the case of including the resin container 61 of Type 1 and Type 2, an applied current I was set to 20 mA. On the other hand, in the case of including the resin container 61 of Type 3, the applied current I was set to 60 mA. These measurement results were the average value of the 20 light emitting units 60 constituting each of the samples S1 to S21. It should be noted that the chromaticity (x, y) is expressed by x value and y value in the Yxy (XYZ) color coordinate system of CIE.

Further, by using a spectral irradiance meter (Konica Minolta Holdings CS1000S), direction dependence of the chromaticity (fluctuations in the chromaticity) of light emitted from each of the samples S1 to S21 was measured. The measurement followed the procedures below. As to the direction vertical to the light emitting surface (emitting surface 65c) of the light emitting unit 60, assuming a perpendicular at the center of the light emitting surface, and the measurement was conducted in the range of 0 degree to 180 degrees to the perpendicular in a single plane including the perpendicular. On the other hand, as to the direction parallel to the light emitting surface, at the location inclined from the above-described perpendicular by 60 degrees, the measurement was conducted while making a 360-degree turn in a plane parallel to the light emitting surface. The degree of fluctuations in the chromaticity is shown by a maximum-minimum difference of each of x value and y value in the direction vertical to and in the direction parallel to the emitting surface 65c, namely, x Δmax-min and y Δmax-min. Further, in each of the samples S1 to S21, measurement was performed in the front of the emitting surface 65c for 1000 light emitting units 60 to evaluate the variations in the chromaticity, which is a standard deviation of x and y. Here, the former intends to quantify the fluctuations in the chromaticity depending upon the directions in a single light emitting unit 60, and the latter intends to quantify the variations in the chromaticity among plural light emitting units 60.

FIG. 9 is a diagram showing a relation between each of the samples used in the examples and the comparative examples and obtained properties. More specifically, FIG. 9 shows a relation between each of the samples S1 to S21 and the applied current I (mA) for each of the samples S1 to S21, an applied voltage V (V) for each of the samples S1 to S21, the output P (mW) of the light from each of the samples 51 to S21, the total light flux φ (lm) outputted from each of the samples S1 to S21, the light emitting efficiency E (lm/W) of each of the samples S1 to S21, the chromaticity (x, y) of the emission color of each of the samples S1 to S21, variations σ of the chromaticity y of each of the samples S1 to S21, x Δmax-min and y Δmax-min corresponding to the degree of fluctuations in the vertical direction in each of the samples S1 to S21, and x Δmax-min and y Δmax-min corresponding to the degree of fluctuations in the parallel direction in each of the samples S1 to S21.

Figure 10:
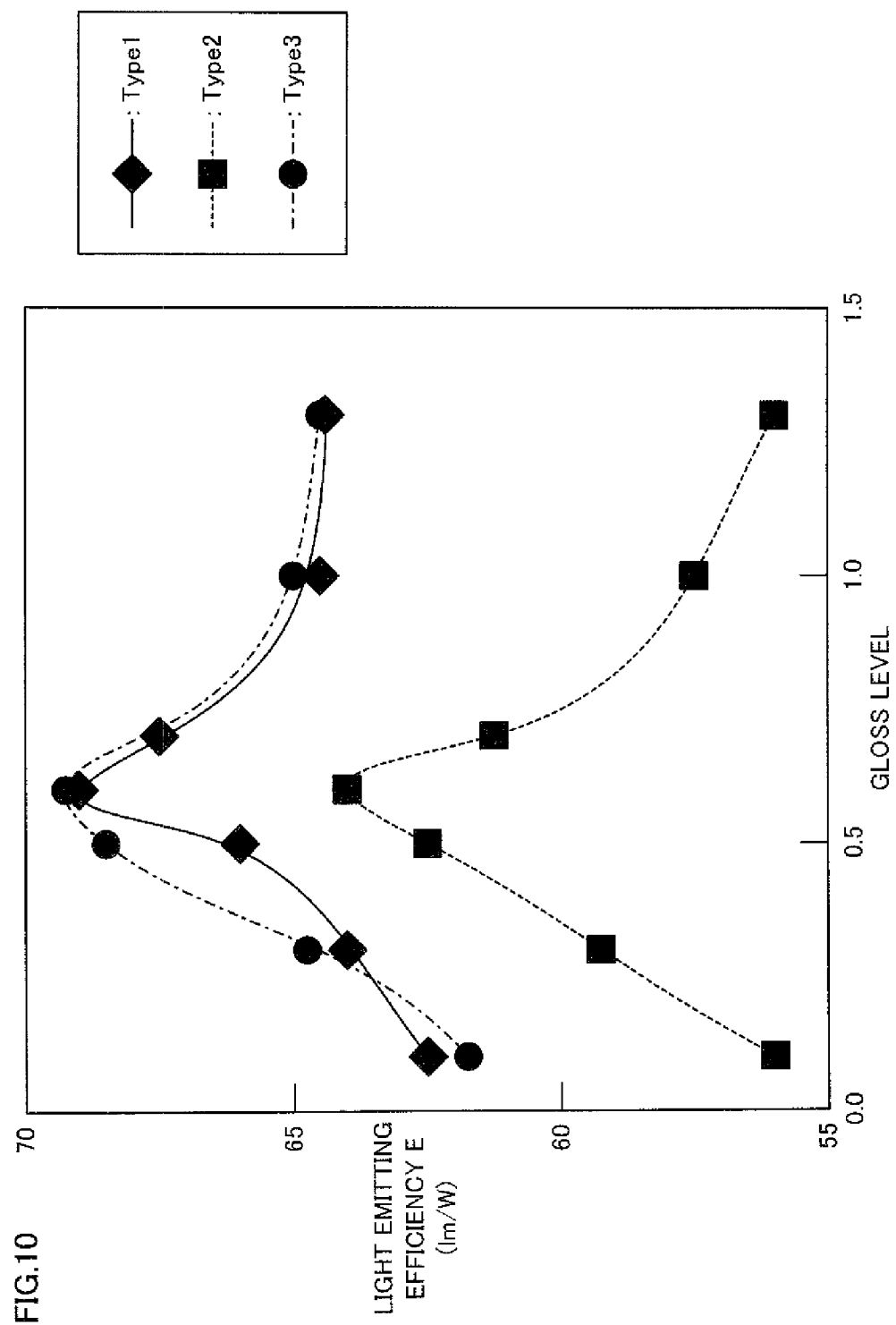
FIG. 10 is a graph showing a relation between the gloss level and the light emitting efficiency in each sample with a type of a lead frame constituting the light emitting unit as a parameter.

And, FIG. 10 is a graph showing a relation between the gloss level and the light emitting efficiency E in each of the samples S1 to S21 with a type of a lead frame (Type 1, Type 2 and Type 3) constituting the light emitting unit 60 as a parameter, based on the relation shown by FIG. 8 and FIG. 9.

As is clear from FIG. 10, in any of Type 1, Type 2 and Type 3, the higher light emitting efficiency E is available in the range of the gloss level of 0.3 to 1.0 in which the lead frame has semi-gloss, compared to the gloss level of 0.1 in which the lead frame is almost non-glossy and the gloss level of 1.3 in which the lead frame has almost the mirror gloss. Moreover, it can be seen that, especially in the range of the gloss level of 0.5 to 0.7, the higher light emitting efficiency E is available. This is because, for example, in the case where the gloss level of the lead frame is 0.1, the light absorption coefficient of the lead frame is increased up to 12% at that time, and therefore the influence of light absorption by the lead frame becomes large. On the other hand, for example, in the case where the gloss level of the lead frame is 1.3, since the reflection property of the lead frame is close to the mirror reflection, the number of reflections of the light reflected by the lead frame until exiting to the emitting surface 65c is increased and the influence of the light absorption by the lead frame or white resin becomes large. Accordingly, it can be understood that the gloss level of the lead frame may be selected from the range of 0.3 to 1.0, and more preferably, from the range of 0.5 to 0.7.

Figure 11:
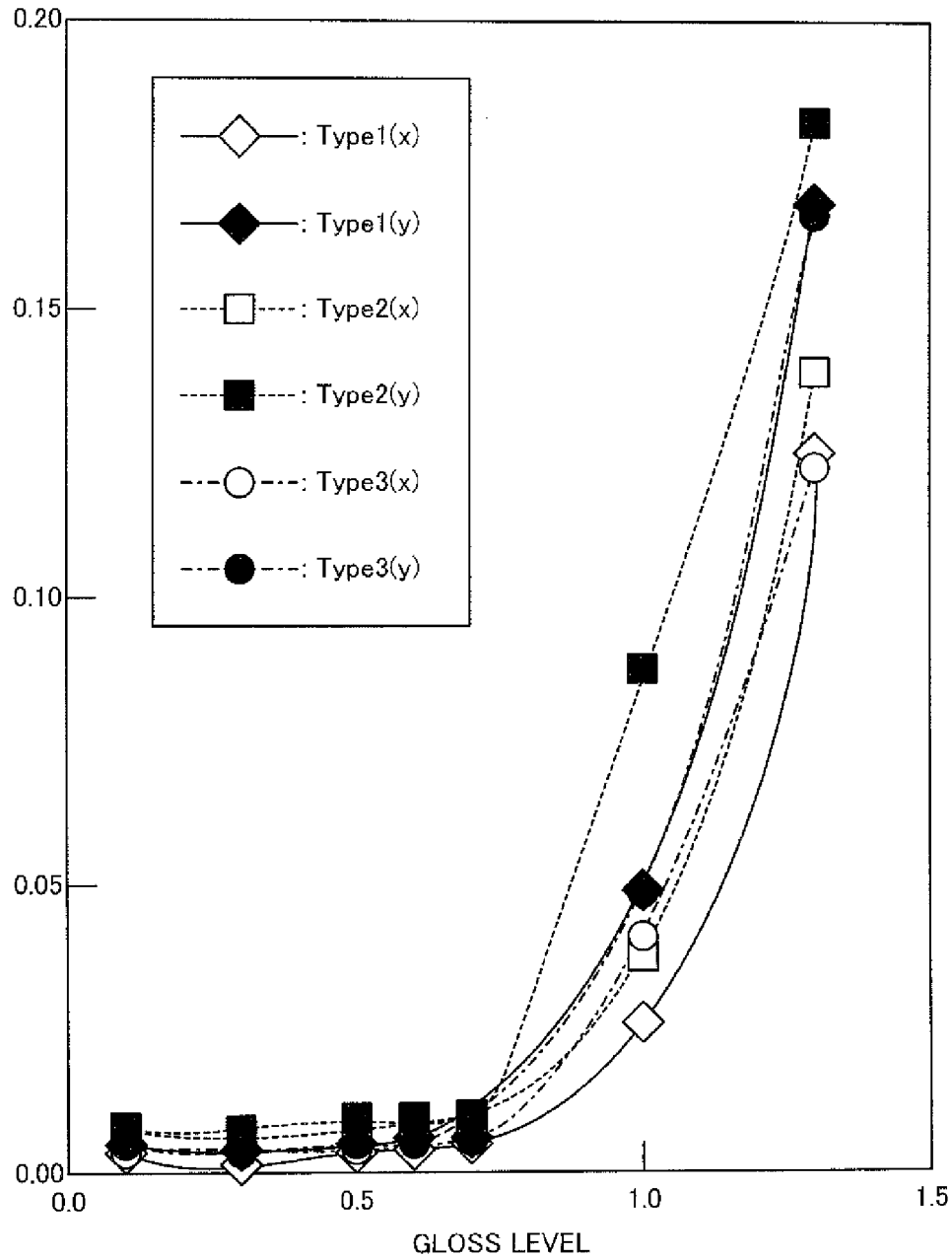
FIG. 11 is a graph showing a relation between the gloss level and a maximum-minimum difference of each of x value and y value in a direction vertical to an emitting surface in each sample with the type of the lead frame constituting the light emitting unit as the parameter.

Further, FIG. 11 is a graph showing a relation between the gloss level of each of the samples S1 to S21 and the maximum-minimum difference of each of x value and y value, namely, x Δmax-min and y Δmax-min in the direction vertical to the emitting surface 65c with a type of a lead frame (Type 1, Type 2 and Type 3) constituting the light emitting unit 60 as a parameter, based on the relation shown by FIG. 8 and FIG. 9. It should be noted that, in FIG. 11, for example, the maximum-minimum difference of x value, namely x Δmax-min of Type 1 (the samples S1, S4, S7, S10, S13, S16 and S19) is shown as Type 1 (x), and the maximum-minimum difference of y value, namely y Δmax-min is shown as Type 1 (y). The same holds true for the other Type 2 (x), Type 2 (y), Type 3 (x) and Type 3 (y).

As is clear from FIG. 11, in any of Type 1, Type 2 and Type 3, it is understood that the fluctuations in x value and y value in the vertical direction on the emitting surface 65c of each light emitting unit 60 is reduced, that is to say, non-uniformity of color in light emitted from each light emitting unit 60 is suppressed, in the range of the gloss level of 0.1 to 1.0 compared to the gloss level of 1.3 in which the lead frame has almost the mirror gloss.

Figure 12:
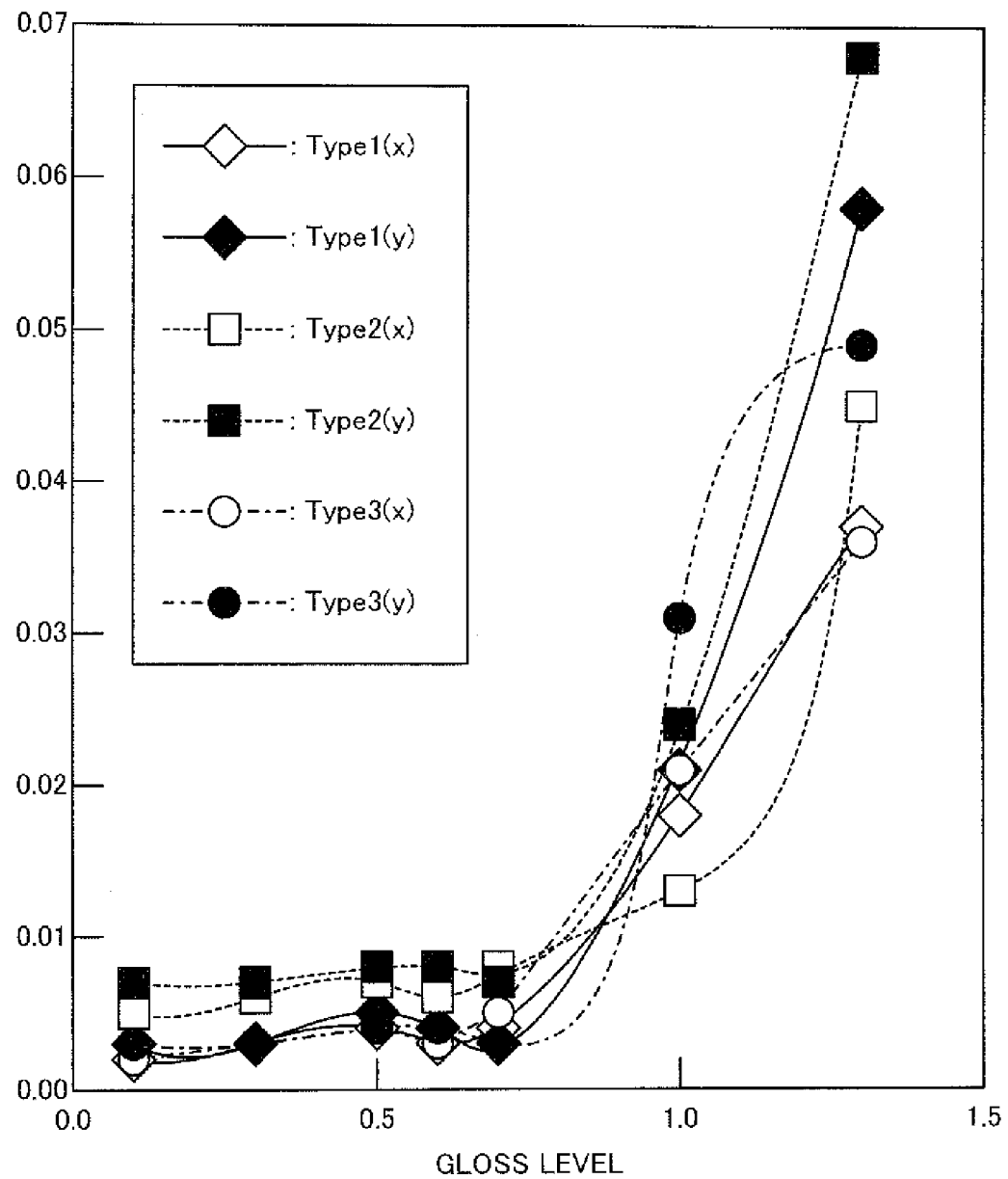
FIG. 12 is a graph showing a relation between the gloss level and a maximum-minimum difference of each of x value and y value in a direction parallel to the emitting surface in each sample with the type of the lead frame constituting the light emitting unit as the parameter.

On the other hand, FIG. 12 is a graph showing a relation between the gloss level of each of the samples S1 to S21 and the maximum-minimum difference of each of x value and y value, namely, x Δmax-min and y Δmax-min in the direction parallel to the emitting surface with a type of a lead frame (Type 1, Type 2 and Type 3) constituting the light emitting unit 60 as a parameter, based on the relation shown by FIG. 8 and FIG. 9. It should be noted that, in FIG. 12, similar to FIG. 11, for example, the maximum-minimum difference of x value, namely x Δmax-min of Type 1 (the samples S1, S4, S7, S10, S13, S16 and S19) is shown as Type 1 (x), and the maximum-minimum difference of y value, namely y Δmax-min is shown as Type 1 (y). The same holds true for the other Type 2 (x), Type 2 (y), Type 3 (x) and Type 3 (y).

As is clear from FIG. 12, in any of Type 1, Type 2 and Type 3, it is understood that the fluctuations in x value and y value in the parallel direction on the emitting surface 65c of each light emitting unit 60 is reduced, that is to say, non-uniformity of color in light emitted from each light emitting unit 60 is suppressed, in the range of the gloss level of 0.1 to 1.0 compared to the gloss level of 1.3 in which the lead frame has almost the mirror gloss. However, as shown in FIG. 12, in the case of the gloss level of 0.1 in which the lead frame is almost non-glossy, the light emitting efficiency becomes lower than the case of the gloss level of 0.3 to 1.0 in which the lead frame has semi-gloss. Accordingly, it can be understood that the gloss level of the lead frame may be selected from the range of 0.3 to 1.0, and more preferably, from the range of 0.5 to 0.7.

Here, in observing the shape of the sealing resin 65 in which the phosphor powder 65a exists, for example, in the resin container 61 of Type 1, the bottom surface 70 is 0.4 mm×3.2 mm and the depth is 0.6 mm; in the resin container 61 of Type 2, the diameter of the bottom surface 70 is 1.6 mm and the depth is 0.6 mm; in the resin container 61 of Type 3, the diameter of the bottom surface 70 is 4.0 mm and the depth is 0.6 mm. As described above, in the resin container 61 of Type 1 and Type 2, the semiconductor light emitting element 64 is mounted on almost the center of the bottom surface 70, and in the resin container 61 of Type 3, three semiconductor light emitting elements 64 are mounted in almost the equilateral-triangular shape on the position deviated from the center of the bottom surface 70. Consequently, the distance from the semiconductor light emitting element 64 to the emitting surface 65c of the sealing resin 65 is different depending on the type of the resin container 61. However, the fluctuations in the direction dependence of the chromaticity are suppressed into a small range irrespective of the shape of the resin container 61. Accordingly, as is clear from the above-described result, the direction dependence of the chromaticity of light outputted from the light emitting unit 60 comes not to depend upon the shape of the recessed portion 61a of the resin container 61 by constituting the resin container 61 with white resin, setting the gloss level of the silver-plated layer of the lead frame exposed on the bottom surface 70 of the resin container 61 to 0.3 to 1.0 inclusive, and further uniformly dispersing the phosphor powder 65a into the sealing resin 65.

Figure 13:
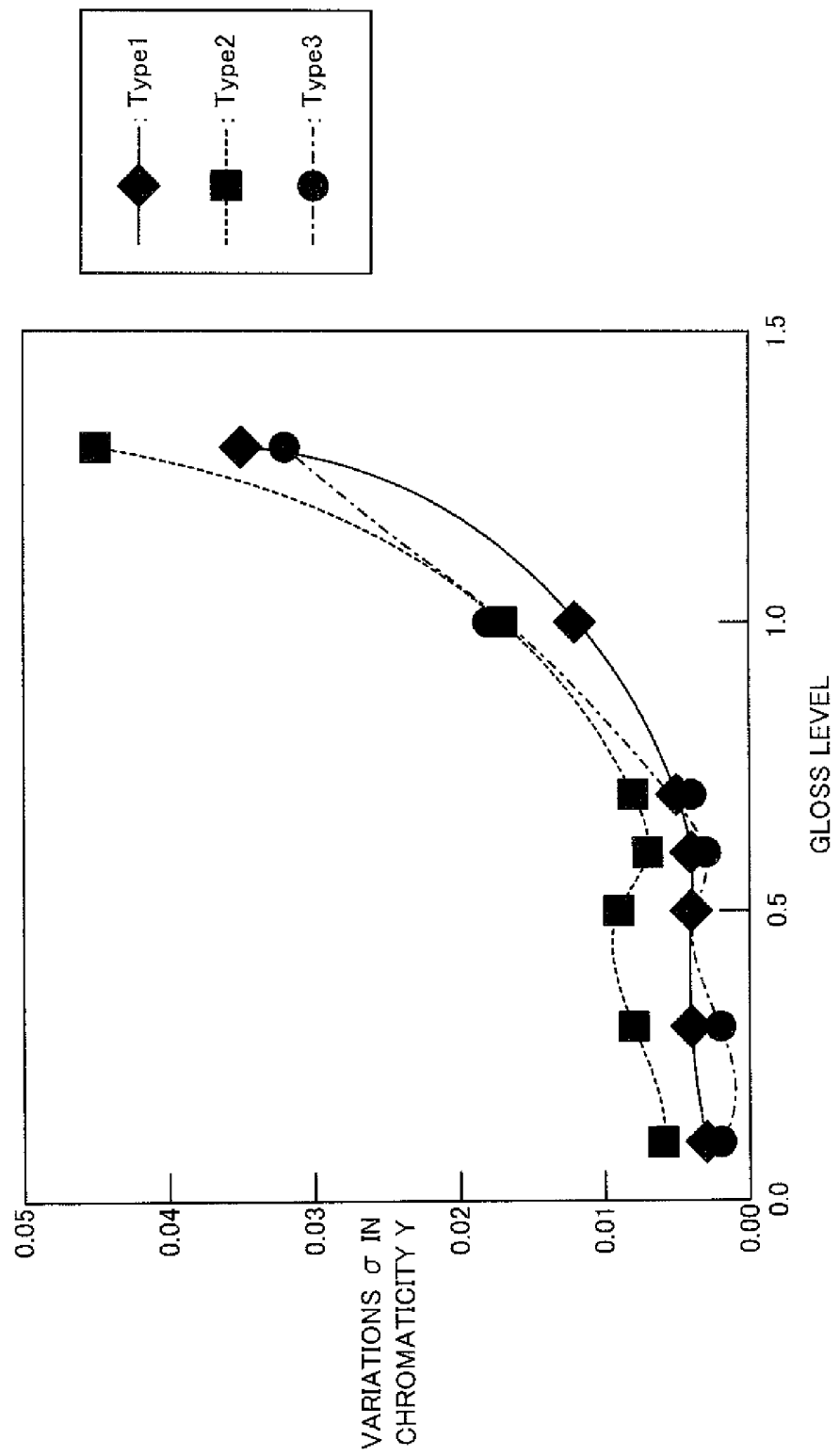
FIG. 13 is a graph showing a relation between the gloss level and variations in chromaticity y among the light emitting units in each sample with the type of the lead frame constituting the light emitting unit as the parameter.

Further, FIG. 13 is a graph showing a relation between the gloss level of each of the samples S1 to S21 and the variations in the chromaticity y among the light emitting units 60 with a type of a lead frame (Type 1, Type 2 and Type 3) constituting the light emitting unit 60 as a parameter, based on the relation shown by FIG. 8 and FIG. 9. It should be noted that, here, 20 samples are prepared for each of the samples S1 to S21, and the variations in the chromaticity y of the light outputted by 20 light emitting units 60 constituting each of the samples S1 to S21 are evaluated as σ.

As is clear from FIG. 13, in any of Type 1, Type 2 and Type 3, it is understood that the variations σ of the chromaticity y becomes smaller, that is to say, non-uniformity of color among the light emitting units 60 is suppressed, in the range of the gloss level of 0.1 to 1.0 compared to the gloss level of 1.3 in which the lead frame has almost the mirror gloss. However, as shown in FIG. 10, in the case of the gloss level of 0.1 in which the lead frame is almost non-glossy, the light emitting efficiency E becomes lower than the case of the gloss level of 0.3 to 1.0 in which the lead frame has semi-gloss. Accordingly, it can be understood that the gloss level of the lead frame may be selected from the range of 0.3 to 1.0, and more preferably, from the range of 0.5 to 0.7.

REFERENCE SIGNS LIST

10 Backlight unit
12 Light emitting module
50 Liquid crystal display module
51 Liquid crystal panel
60 Light emitting unit
61 Resin container
61a Recessed portion
61b Top surface
62 Anode lead portion
62a First anode lead portion
62b Second anode lead portion
62c Third anode lead portion
63 Cathode lead portion
64 Semiconductor light emitting element
64a First semiconductor light emitting element
64b Second semiconductor light emitting element
64c Third semiconductor light emitting element
65 Sealing resin
65a Phosphor powder
65b Transparent resin
65c Emitting surface
70 Bottom surface
80 Wall surface

The invention claimed is:

1. A light emitting unit comprising:
a resin container including a recessed portion;
a conductor portion including a metal conductor and a silver-plated layer having a gloss level of 0.3 to 1.0 inclusive formed on a surface of the metal conductor, the conductor portion being arranged in an exposed state inside the recessed portion of the resin container;
a light emitting element that is provided inside the recessed portion and electrically connected to the conductor portion; and
a sealing resin having a transmittance for light emitted by the light emitting element and sealing the light emitting element in the recessed portion.

2. The light emitting unit according to claim 1, wherein the conductor portion reflects the light from the light emitting element with a reflection property of a Lambertian type obtained by the silver-plated layer having the gloss level of 0.3 to 1.0 inclusive.

3. The light emitting unit according to claim 1, wherein the sealing resin contains a transparent resin that is transparent with respect to an emission wavelength of the light emitting element, and a phosphor that is dispersed into the transparent resin and converts the emission wavelength of the light emitting element into light of a longer wavelength.

4. The light emitting unit according to claim 3, wherein the sealing resin has an emitting surface that emits light outputted from the light emitting element to outside, the emitting surface having a recessed shape that recesses from a boundary portion side with the resin container toward a center portion side, and an amount of recessing of the emitting surface is set in a range of 20 μm to 100 μm inclusive.

5. The light emitting unit according to claim 3, wherein a plurality of the light emitting elements are attached to the inside of the recessed portion.

6. The light emitting unit according to claim 1, wherein the resin container is whitened by using a white pigment.

7. The light emitting unit according to claim 1, wherein the gloss level of the silver-plated layer in the conductor portion is from 0.5 to 0.7 inclusive.

8. The light emitting unit according to claim 1, wherein the sealing resin is composed of a silicone resin.

9. A light emitting unit comprising:
a resin container provided with a recessed portion including a bottom surface and a wall surface that rises up from an edge around the bottom surface;
a conductor portion including a metal conductor and a silver-plated layer having a gloss level of 0.3 to 1.0 inclusive formed on a surface of the metal conductor, the conductor portion being arranged on the bottom surface of the recessed portion in an exposed state;
a light emitting element that is provided on the bottom surface of the recessed portion and electrically connected to the conductor portion; and a sealing resin having a transmittance for light emitted by the light emitting element and sealing the light emitting element in the recessed portion.

10. The light emitting unit according to claim 9, wherein the conductor portion reflects the light from the light emitting element with a reflection property of a Lambertian type obtained by the silver-plated layer having the gloss level of 0.3 to 1.0 inclusive.

11. The light emitting unit according to claim 9, wherein the sealing resin contains a transparent resin that is transparent with respect to an emission wavelength of the light emitting element and a phosphor that is dispersed into the transparent resin and converts the emission wavelength of the light emitting element into light of a longer wavelength, and the light emitting element is attached to a position different from a center position of the bottom surface.

12. The light emitting unit according to claim 9, wherein the resin container is composed of a resin containing fine particles of titania.

13. The light emitting unit according to claim 9, wherein the gloss level of the silver-plated layer in the conductor portion is from 0.5 to 0.7 inclusive.

14. The light emitting unit according to claim 9, wherein a light reflectance in a visible region of the resin container and the silver-plated layer of the conductor portion is from 85% to 98% inclusive.

15. The light emitting unit according to claim 9, wherein an area of the conductor portion exposed on the bottom surface of the recessed portion is set to equal to or more than half of a total area of the bottom surface.

16. A light emitting module comprising:
a substrate; and
a plurality of light emitting units attached to the substrate,
wherein each of the light emitting units comprises:
a resin container including a recessed portion;
a conductor portion including a metal conductor and a silver-plated layer having a gloss level of 0.3 to 1.0 inclusive formed on a surface of the metal conductor, the conductor portion being arranged in an exposed state inside the recessed portion of the resin container;
a light emitting element that is provided inside the recessed portion and electrically connected to the conductor portion; and
a sealing resin having a transmittance for light emitted by the light emitting element and sealing the light emitting element in the recessed portion.

17. The light emitting module according to claim 16, wherein the conductor portion of the light emitting unit reflects the light from the light emitting element with a reflection property of a Lambertian type obtained by the silver-plated layer having the gloss level of 0.3 to 1.0 inclusive.

18. The light emitting module according to claim 16, wherein the sealing resin of the light emitting unit contains a transparent resin that is transparent with respect to an emission wavelength of the light emitting element, and a phosphor that is dispersed into the transparent resin and converts the emission wavelength of the light emitting element into light of a longer wavelength.

19. The light emitting module according to claim 18, wherein the light emitting element of the light emitting unit is attached to a position different from a center position of a bottom surface of the recessed portion.

20. The light emitting module according to claim 16, wherein the resin container of the light emitting unit is whitened by using a white pigment.

21. The light emitting module according to claim 16, wherein the gloss level of the silver-plated layer in the conductor portion of the light emitting unit is from 0.5 to 0.7 inclusive.

22. A display device comprising:
a display panel that performs display of an image; and
a backlight that is provided on a back surface of the display panel and applies light from the back surface side of the display panel,
wherein the backlight comprises:
a substrate; and
a plurality of light emitting units attached to the substrate,
wherein each of the light emitting units comprises:
a resin container including a recessed portion;
a conductor portion including a metal conductor and a silver-plated layer having a gloss level of 0.3 to 1.0 inclusive formed on a surface of the metal conductor, the conductor portion being arranged in an exposed state inside the recessed portion of the resin container;
a light emitting element that is provided inside the recessed portion and electrically connected to the conductor portion; and
a sealing resin containing a transparent resin that is transparent with respect to an emission wavelength of the light emitting element and a phosphor that is dispersed into the transparent resin and converts the emission wavelength of the light emitting element into light of a longer wavelength, and sealing the light emitting element in the recessed portion.

23. The display device according to claim 22, wherein the conductor portion of the light emitting unit reflects the light from the light emitting element with a reflection property of a Lambertian type obtained by the silver-plated layer having the gloss level of 0.3 to 1.0 inclusive.

24. The display device according to claim 22, wherein the resin container of the light emitting unit is whitened by using a white pigment.

25. The display device according to claim 22, wherein the gloss level of the silver-plated layer in the conductor portion of the light emitting unit is from 0.5 to 0.7 inclusive.

* * * * *